United States Patent
Ganesan et al.

[11] Patent Number: 6,138,266
[45] Date of Patent: Oct. 24, 2000

[54] FUNCTIONAL VERIFICATION OF INTEGRATED CIRCUIT DESIGNS

[75] Inventors: Subbu Ganesan, Saratoga; Shyam Prasad Pillalamarri, Palo Alto, both of Calif.

[73] Assignee: Tharas Systems Inc., Santa Clara, Calif.

[21] Appl. No.: 09/097,874

[22] Filed: Jun. 15, 1998

Related U.S. Application Data

[60] Provisional application No. 60/048,939, Jun. 16, 1997.
[51] Int. Cl.$^7$ ...................................................... G06F 17/50
[52] U.S. Cl. ........................................ 716/5; 716/4; 716/1
[58] Field of Search ........................ 395/500.06, 500.05, 395/500.34, 500.02; 716/5, 4, 1

[56] References Cited

U.S. PATENT DOCUMENTS

| | | | |
|---|---|---|---|
| 4,949,341 | 8/1990 | Lopez et al. ............................ | 371/25.1 |
| 5,416,719 | 5/1995 | Pribetich .................................... | 716/2 |
| 5,481,469 | 1/1996 | Brasen et al. ............................ | 364/483 |
| 5,551,013 | 8/1996 | Beausoleil et al. ................. | 395/500.44 |
| 5,572,710 | 11/1996 | Asano et al. ......................... | 395/500.36 |
| 5,649,165 | 7/1997 | Jain et al. ............................... | 395/500 |
| 5,650,983 | 7/1997 | Bootehsaz et al. ..................... | 364/490 |
| 5,719,817 | 2/1998 | Schaefer .............................. | 365/230.03 |
| 5,751,592 | 5/1998 | Takai et al. .................................. | 716/5 |
| 5,754,454 | 5/1998 | Pixley et al. ............................ | 364/580 |
| 5,805,462 | 9/1998 | Poirot et al. ............................ | 364/490 |
| 5,809,283 | 9/1998 | Vaidyanathan et al. ................. | 395/500 |
| 5,913,043 | 6/1999 | Carter et al. ............................ | 395/280 |
| 5,999,480 | 12/1999 | Ong et al. .......................... | 365/230.06 |

*Primary Examiner*—Paul R. Lintz
*Assistant Examiner*—Vuthe Siek
*Attorney, Agent, or Firm*—Law Firm of Naren Thappeta

[57] ABSTRACT

A functional verification system suited for verifying the function of cycle based integrated circuits (IC) design. The IC design is divided into a plurality of combinatorial blocks connecting sequential elements. Truth tables corresponding the divided blocks are computed and stored in a memory. The output values of the IC design are determined by evaluating the blocks. The evaluation typically entails one memory access as the truth tables are pre-computed and stored in a memory storage. Accordingly the output values are computed quickly. The storage is implemented using random access memories and a XCON is designed to ensure the dependencies are preserved during the evaluations.

31 Claims, 22 Drawing Sheets

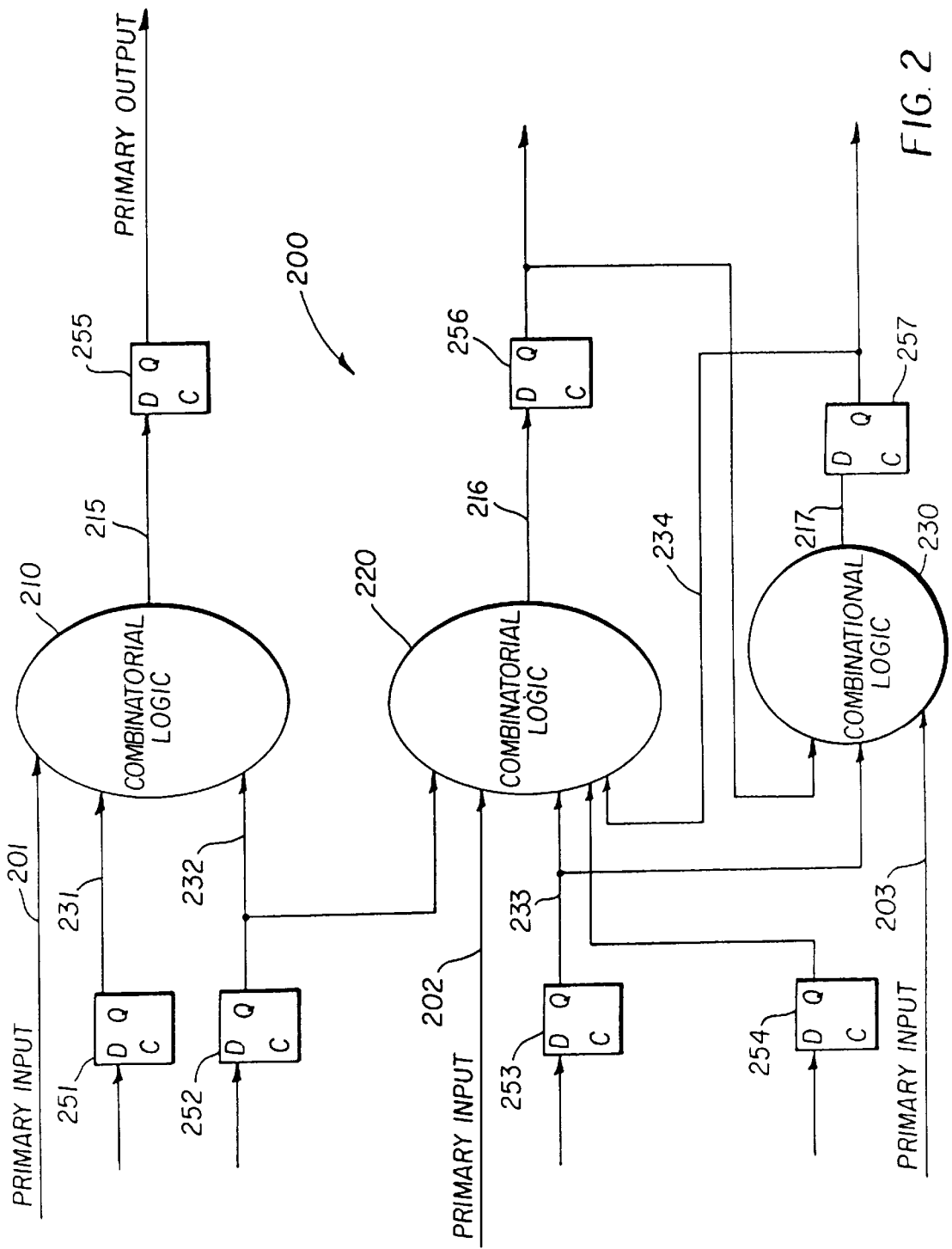

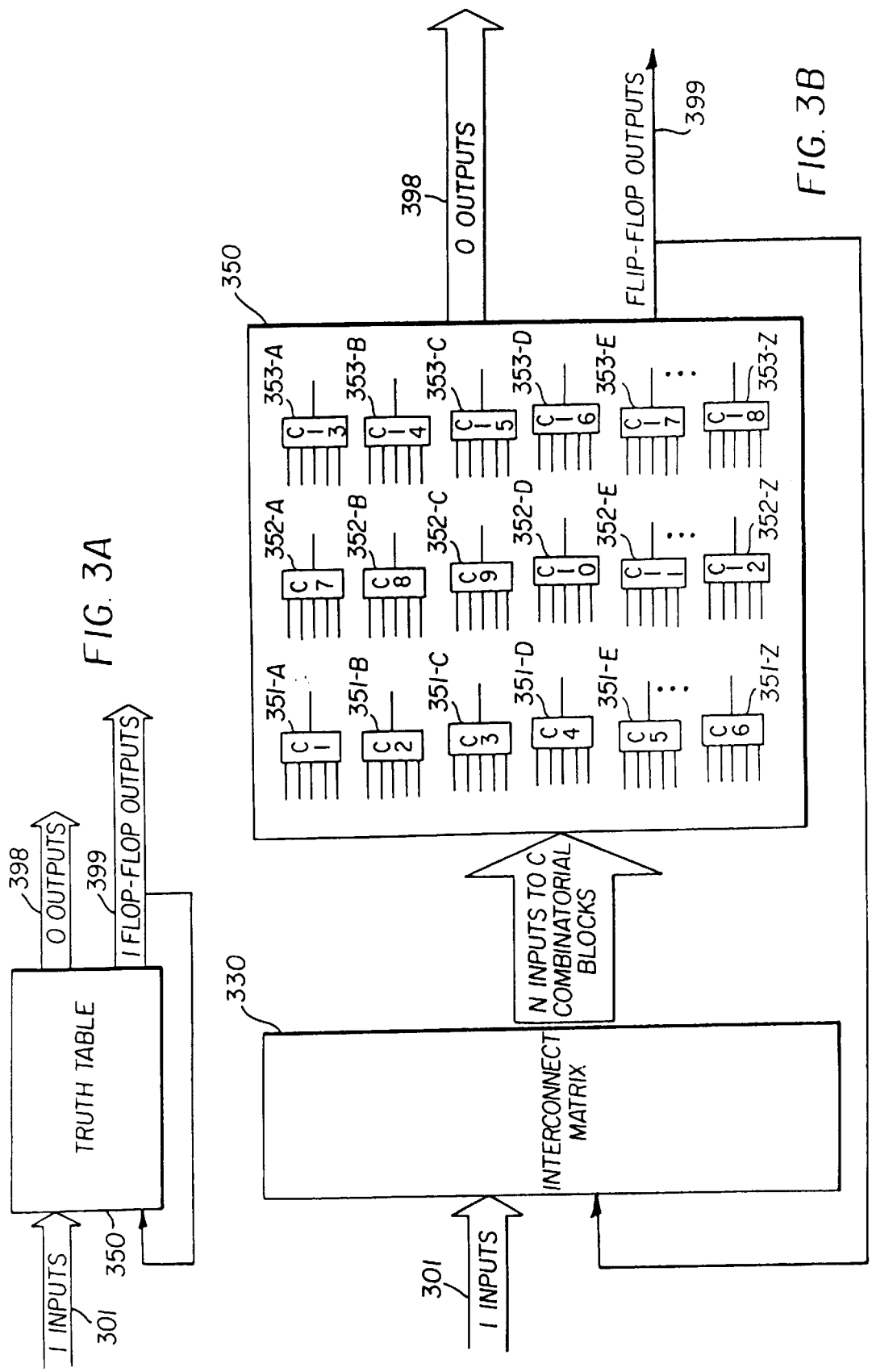

| VALUE 1 | VALUE 1 |
|---------|---------|
| VALUE 2 | VALUE 2 |
| VALUE 3 | VALUE 3 |
| VALUE 4 | VALUE 4 |
| VALUE 5 | VALUE 5 |
| VALUE 6 | VALUE 6 |
| VALUE 7 | VALUE 7 |
| VALUE 8 | VALUE 8 |
| VALUE 9 | VALUE 9 |
| VALUE 10 | VALUE 10 |
| VALUE 11 | VALUE 11 |
| VALUE 12 | VALUE 12 |
| VALUE 13 | VALUE 13 |
| VALUE 14 | VALUE 14 |
| VALUE 15 | VALUE 15 |
| VALUE 16 | VALUE 16 |
| VALUE 17 | VALUE 17 |
| VALUE 18 | VALUE 18 |
| VALUE 19 | VALUE 19 |
| VALUE 20 | VALUE 20 |
| VALUE 21 | VALUE 21 |
| VALUE 22 | VALUE 22 |
| VALUE 23 | VALUE 23 |
| VALUE 24 | VALUE 24 |
| VALUE 25 | VALUE 25 |
| VALUE 26 | VALUE 26 |
| VALUE 27 | VALUE 27 |
| VALUE 28 | VALUE 28 |
| VALUE 29 | VALUE 29 |
| VALUE 30 | VALUE 30 |
| VALUE 31 | VALUE 31 |
| VALUE 32 | VALUE 32 |
| BIT1 | BIT0 |

Left brace: FUNCTION 3 (BIT1 column); Right brace: FUNCTION 4 (BIT0 column)

5 BIT ADDRESS (SAME FOR BOTH FUNCTIONS) →

FIG. 12A

| FUNCTION 5 | VALUE 1 | VALUE 1 | FUNCTION 6 |
|---|---|---|---|
| | VALUE 2 | VALUE 2 | |
| | VALUE 3 | VALUE 3 | |
| | VALUE 4 | VALUE 4 | |
| | VALUE 5 | VALUE 5 | |
| | VALUE 6 | VALUE 6 | |
| | VALUE 7 | VALUE 7 | |
| | VALUE 8 | VALUE 8 | |
| | VALUE 9 | VALUE 9 | |
| | VALUE 10 | VALUE 10 | |
| | VALUE 11 | VALUE 11 | |
| | VALUE 12 | VALUE 12 | |
| | VALUE 13 | VALUE 13 | |
| | VALUE 14 | VALUE 14 | |
| | VALUE 15 | VALUE 15 | |
| | VALUE 16 | VALUE 16 | |
| | VALUE 17 | VALUE 1 | |
| | VALUE 18 | VALUE 2 | |
| | VALUE 19 | VALUE 3 | |
| | VALUE 20 | VALUE 4 | |
| | VALUE 21 | VALUE 5 | |
| | VALUE 22 | VALUE 6 | |
| | VALUE 23 | VALUE 7 | |
| | VALUE 24 | VALUE 8 | |
| | VALUE 25 | VALUE 9 | |
| | VALUE 26 | VALUE 10 | |
| | VALUE 27 | VALUE 11 | |
| | VALUE 28 | VALUE 12 | |
| | VALUE 29 | VALUE 13 | |
| | VALUE 30 | VALUE 14 | |
| | VALUE 31 | VALUE 15 | |
| | VALUE 32 | VALUE 16 | |
| | BIT1 | BIT0 | |

5 BIT ADDRESS (SAME FOR BOTH FUNCTIONS)

FIG. 12B

FUNCTIONAL VERIFICATION OF INTEGRATED CIRCUIT DESIGNS

RELATED APPLICATIONS

The present application is related to and claims priority from Provisional Patent Application entitled "Logic Verification Using Commercial Random Access Storage Devices", Ser. No. 60/048,939, filed Jun. 16, 1997, and is incorporated in its entirety into the present application herewith.

BACKGROUND OF THE INVENTION

1. Field of the Invention

The present invention relates to the electronic design of integrated circuits, and more specifically to a method and apparatus for the functional verification of a target integrated circuit design.

2. Related Art

Functional verification is one of the steps in the design of many integrated circuits. Functional verification generally refers to determining whether a design ("target design") representing an integrated circuit performs a function it is designed for. In a typical design process, a designer identifies the functions to be performed and designs a circuit using high-level languages (e.g., VHDL language well known in the relevant arts) to perform the identified functions. An example of a function may be to generate a predetermined output data corresponding to a given input data. Tools available in the industry are typically used to generate a lower-level design (e.g., at gate-level) from the design specified in a high-level language. The higher level languages are generally more understandable to a user (human-being) while the lower level languages are closer in representation to the physical implementation.

Usually, the lower level design is evaluated against input data to generate output data. A determination of the accuracy of a functional design may be made based on the output data. The manner in which input data is generated and output data is used for determination of accuracy may depend on the specific type of verification environment. For example, in an emulation environment, the target design receives input data in a "real environment" usually having other components, whose operation can be relied on for accuracy. The target design is implemented to typically operate at least with these other components. By testing the target design in combination with these other components, functional verification of the target design can be performed. In general, a functional verification system operating in an emulation environment needs to generate output data values quickly such that the output data is available in a timely manner for the other components.

In contrast, in a simulation environment, a designer specifies pre-determined input data and evaluates the target design against the input data. The output data generated by the evaluation is examined to determine whether the design performs the desired functions. Once a designer is satisfied with a design, the data representing the design is sent for fabrication as an integrated circuit. Speed of verification may not be as important in simulation environments as cost of implementation.

Accuracy in the functional verification is an important requirement in the design process for several reasons. For example, it is relatively less expensive to alter a circuit design prior to fabrication compared to re-designing and sending the design data for fabrication. In addition, it may require several weeks of time to redesign and complete fabrication again. Such levels of delays may be unacceptable, particularly in the high-technology markets where short design cycles are generally important.

In addition to accuracy, the verification step needs to scale well to the functional verification of integrated circuits of large sizes. That is, a verification systems needs to provide for verification of integrated circuit designs of large sizes. As is well known, an integrated circuit (semi-conductor chip) can include transistors of the order of a few millions, and the number has been increasing over time.

Furthermore, it is generally desirable that the verification step be completed quickly or with minimal internal computations. The speed of verification is particularly important in view of the increase in size and complexity of integrated circuits. To decrease the total design cycle time, it is desirable that the functional verification be completed quickly.

Therefore, what is needed is an efficient and cost-effective method and apparatus for the functional verification of integrated circuit designs, which can be used with complex integrated circuits.

SUMMARY OF THE INVENTION

The present invention is directed to functional verification of integrated circuit designs ("target designs"). The present invention enables functional verification to be performed quickly in a cost-effective manner. Speed is achieved by dividing a target design into combinatorial logic connecting several sequential elements (e.g., flip-flops). In turn, the combinatorial logic is divided into smaller blocks such that the corresponding truth tables can be stored in commercially available random access storage devices (RASDs). The truth tables of the divided blocks are stored in RASDs.

To generate the output data values of a target design corresponding to input data values ("primary inputs") provided from outside, the divided blocks are evaluated using the primary inputs. Once the inputs (or values) for a block are available, evaluation typically entails a single memory access as the truth tables are pre-computed and stored in RASDs.

However, an output of a block may be used as an input by another block ("dependent block"). The dependencies are generally dictated by the target design and preserved during the division into combinatorial blocks. To preserve dependencies, a cross-connect controller (XCON) is employed. The XCON controller controls accesses to memory and provides the output data value of evaluations to the blocks requiring the value as an input.

In an embodiment, only the output values computed in a truth table are stored in RASDs. The address locations stored in RASDs are computed according to the input values from which each output value is generated. As an illustration, assuming a RASD having a four bit address line and a block (truth table) operates using four inputs, the output data value corresponding to input bits of 1011 may be stored at address location 1011. Accordingly, the address computation and retrieval can be performed without having to expend substantial time or computations.

An XCON controller along with one or more RASDs may be termed as a combinatorial logic output evaluator (CLOE). Typical implementations include several CLOEs to operate in conjunction with complex target designs. Many CLOEs are provided in a verification board and several such boards form a chassis. Many chassis may be inter-connected. In an embodiment, the XCON controllers are used for inter-CLOE communication in addition to preserving dependencies during evaluation of blocks.

RASDs can be implemented using commercially available random access memories and XCON CONTROLLERS can be implemented using integrated circuits implemented in accordance with the present invention. Accordingly, both the components can be implemented relatively cost-effectively. The other components required for providing a functional verification system can also be implemented cost-effectively. As a result, an effective functional verification system can be provided at a low cost by using the present invention.

In addition, if two blocks operate using the same inputs, the output data values of both the blocks can be stored in the same location in a different bit position such that both output data values can be retrieved in one memory access. Applying the same principle, the output data value of more than two blocks can be evaluated in one memory access by storing the output values in accordance with the storage scheme described here.

If a first block operates using a sub-set of the inputs of a second block, the output values of the first block can be replicated such that both blocks can be evaluated in a single memory access. Specifically, an output value of the first block corresponding to a set of input data values is stored in multiple locations sharing the input data values in the address. For example, assuming a four bit address and the first block operates using three inputs and the second operates using four inputs, the output of the first block corresponding to inputs 110 is stored in the locations with address 110X (X=0 and 1), that is in locations with address 1100 and 1101. As a result, the outputs of both the first block and the second block can be computed (or retrieved) in a single memory access.

If multiple blocks use less number of inputs than the number of address bits, the bits not formed using the input bit values can be used to select the functions. Assuming a RASD using an eight bit address and blocks using only five bits of inputs, the three bits can be used to select functions. Thus, the three bits can be used to identify eight functions, and the remaining five bits can be formed by the input data values such that the address of the location can be formed without much computational or storage requirements.

In addition, to take advantage of the width (the number of bits in each memory location), several functions may be grouped as clusters, and the output values of the functions in the cluster may be stored in shared memory locations. Multiple copies of the output values can also be stored in clusters to enable multiple functions to be evaluated in a single memory access.

The above memory schemes can be combined, potentially even with other schemes, to increase the throughput performance and the size of the integrated circuit which can be supported. For example, the case when blocks use less number of inputs than the number of address bits (described in the preceding paragraph) can be combined with the case in which multiple outputs are stored in the location to retrieve output values of multiple blocks in a single memory access. In such a scenario, some bits of a memory address are formed by input data values and the other bits of the address identify a group of blocks. The individual bit positions represent the output values of individual blocks.

Therefore, the present invention provides a system for verifying the functionality of an integrated circuit design.

The present invention scales well to complex target designs because each block can have several inputs, and a block can be evaluated in a single memory access. That is, due to the ability to have blocks with several inputs, a complex target design can be divided into potentially large blocks, with each block being evaluated in a single memory access. Accordingly, complex target designs can be verified quickly.

The present invention is particularly suited for emulation environments as the output corresponding to a combination of input values can be generated quickly. The quickness may be achieved due to the pre-computation of the truth tables and accessing the values using random access memories.

The present invention is suited for simulation environments also as a verification system can be implemented in a cost-effective manner at the expense of lower throughput performance.

The present invention is particularly suited for cycle-based designs (which do not have combinatorial loops) as the design can be modeled as a combinatorial logic blocks connecting sequential elements.

The present invention enables functional verification to be performed quickly as typical evaluation of blocks can be performed in a single memory access.

The present invention enables a functional verification system to be implemented in a cost-effective manner as most of the required components are either available in the market place or can be implemented as low cost integrated circuits.

Further features and advantages of the invention, as well as the structure and operation of various embodiments of the invention, are described in detail below with reference to the accompanying drawings. In the drawings, like reference numbers generally indicate identical, functionally similar, and/or structurally similar elements. The drawing in which an element first appears is indicated by the leftmost digit(s) in the corresponding reference number.

BRIEF DESCRIPTION OF THE DRAWINGS

The present invention will be described with reference to the accompanying drawings, wherein:

FIG. 2 is a block diagram of an example integrated circuit illustrating the manner in which a circuit can be modeled as a group of combinatorial logic between sequential elements (flip-flops);

FIGS. 3A, 3B and 3C illustrate the manner in which a target design can be divided into smaller combinatorial blocks while preserving the dependencies dictated by the target design;

FIG. 12A is a block diagram illustrating the manner in which truth tables of multiple blocks can be stored such that all the blocks can be evaluated in a single memory access;

FIG. 12B is a diagram illustrating the manner in which multiple copies of the output data values of a truth table can be stored in a RASD for efficient evaluation of combinatorial logic blocks;

DETAILED DESCRIPTION OF THE PREFERRED EMBODIMENTS

1. Overview and Discussion of the Invention

The present invention enables the functional verification of an integrated circuit design ("target design") to be performed in a quick and cost-effective manner. The quickness is achieved by logically partitioning the target design into small combinatorial blocks, and computing the truth table for each block. That is, the output corresponding to various combination of input values of each block are computed. The truth table for each block is stored in a memory. The truth tables are used in determining the output of each block while evaluating the output data for the whole target design in response to a given input data.

As the pre-stored truth table for the corresponding block may be used while evaluating the outputs of each block, the evaluation can typically be performed in a single memory access.

An embodiment described below uses the input values (which may be output values of blocks in previous stages) as addresses to the memory. Accordingly, substantial computations may not be required in determining the memory address. As a result, the output data corresponding to a given input values combination for a target design can be evaluated very quickly in accordance with the present invention. Due to the speed of evaluation, the present invention is particularly suited for large integrated circuits.

The present invention is described below in further detail with reference to several examples. The method of the present invention is described first. Example environments and systems in which the present invention can be implemented are described later.

2. Method of the Present Invention

Figure 1:
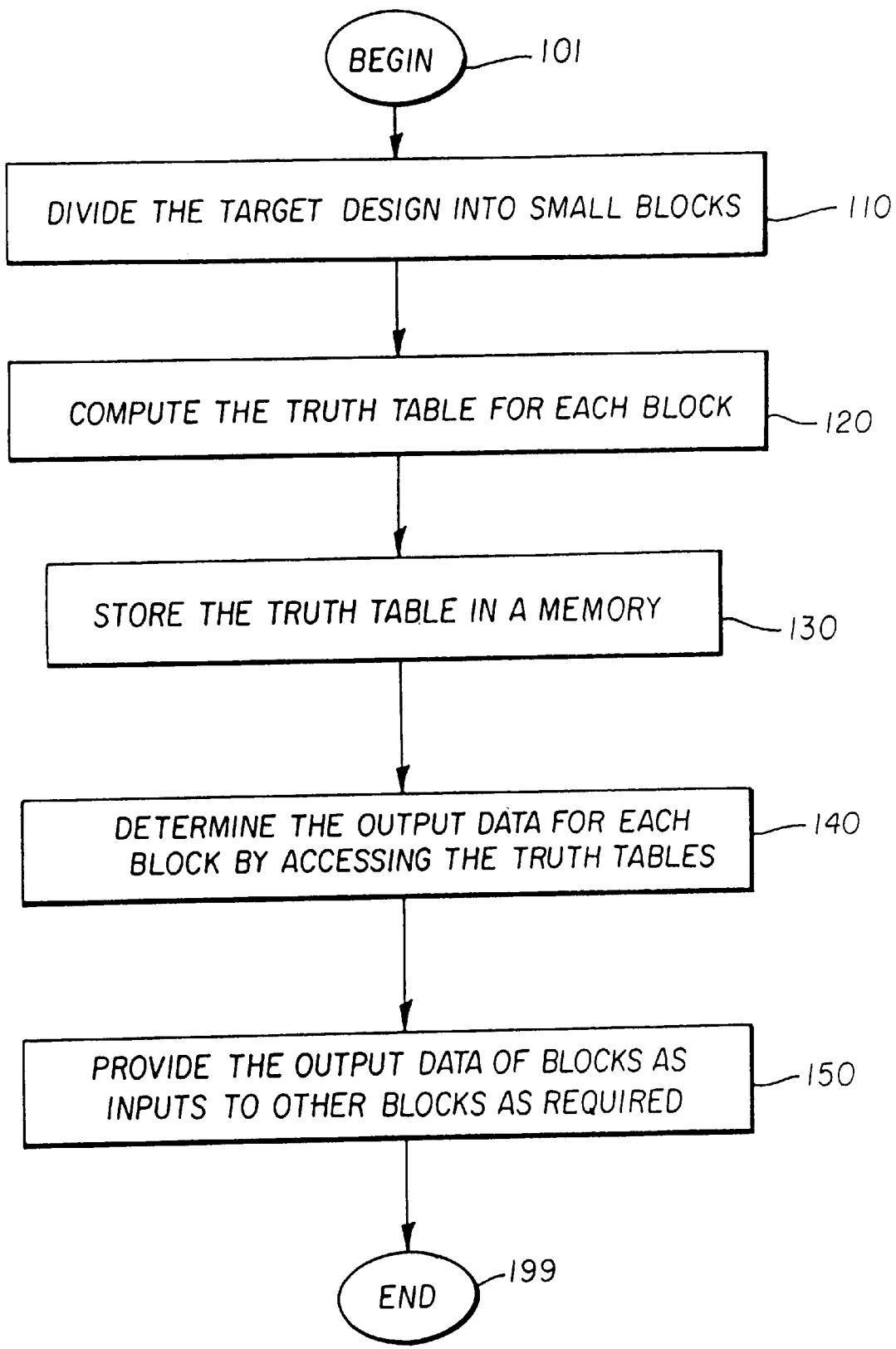
FIG. 1 is a flow-chart of a method in accordance with the present invention which enables efficient and fast verification of an integrated circuit design.

A method in accordance with the present invention is described with general reference to the flow-chart of FIG. 1. In step 110, a target design to be verified is logically divided into smaller combinatorial blocks. The division operation depends on the manner in which a target design is represented. Combination of manual and automatic (e.g., implemented in software by the examination of design data) steps can be employed to achieve the division. The division generally enables the truth tables to be small in size, making storing and retrieving operations practicable with many commercially available memory storage devices. Each block can have multiple inputs and outputs. One division scheme is described below in further detail.

In step 120, the truth table for each block is evaluated typically in a known way. The truth table is stored in a memory storage in step 130. A typical memory storage includes several memory units to accommodate large amount data as may be required for verifying complex target designs. Due to the division in step 110, the truth tables can generally be made of manageable size as described in further detail in the below paragraph.

As is well known, a truth table generally identifies an output value corresponding to a combination of input values for a corresponding combinatorial block. Different components of the truth table can be stored in a memory storage. In am embodiment, only the output values are stored for efficient usage of the memory space. In addition, by using the input values as an address to the memory storage, the computations required to generate an location address in the memory space are also minimized, leading to a quick evaluation of a target design for a given combination of primary input values.

The size of a truth table required to represent the aggregate of all the combinatorial functions in a target design is an exponential function (i.e., power of two) of the sum of the number of primary inputs and the total number of outputs from all the sequential elements (e.g., flip-flops) in the design. This means that if there are 64 primary inputs in the design and 128 flip-flops and 32 primary outputs, the size of the memory required to hold the truth table for the entire design's aggregated logic will be 2(64+128) location with each location needing to be (128+32) bits wide. Given that 220 is 1 million, 2(64+128) is generally impractical to use as one truth table. Apart from the size of the memory required, even determining all the locations in such a truth table is also exponential. Even assuming that the output for one input data combination can be computed in 1 nanosecond, it would require 2(64+128) nanoseconds to compute the entire truth table. Such large times may also not be acceptable. Accordingly, the division of step 110 enables the truth tables to be of smaller sizes.

Continuing with the description of FIG. 1, steps 140 and 150 operate to evaluate the output values of the target design for a given input values combination. The evaluation in turn typically entails determining the inputs of each block and evaluating the output value of each block according to the corresponding input values. The inputs of many blocks may depend ("dependency") on the outputs of other blocks and on the data stored in sequential elements (e.g., flip-flops) as specified by the target design. Accordingly, mechanisms need to be designed to preserve dependencies while evaluating a target design for a given input vector (data). Several such mechanisms will be apparent to one skilled in the relevant arts at least based on the disclosure provided herein and these mechanisms are contemplated to be within the scope and spirit of the present invention. An example mechanism is described in detail below.

The output values of a block can be evaluated once the input values for the block are available. Typical evaluation of a block can be performed with a single memory access as the truth table is pre-stored in step 130. As a result, the output data for the target design can be determined in a short duration in accordance with the present invention. Thus, the present invention enables speedy functional evaluation of a target integrated circuit design.

The manner in which the present invention can be used is described below with respect to several embodiments below. The invention has particular application in integrated circuits conforming to cycle based design. Accordingly, the cycle based design is described first.

3. Cycle Based Design

FIG. 2 is block diagram of an example target design illustrating cycle based design 200 in which the present invention can be implemented. Cycle-based designs are characterized by the absence of combinatorial loop-backs, that is, the output of a combinatorial block is not provided as an input to the same block without a sequential element in between. In general, a cycle-based design includes stages of sequential elements (e.g., flip-flops) whose inputs are a combinatorial function of one or more primary inputs (i.e., provided from outside of the target design) and one or more outputs of other sequential elements. The output signals of the target design will be referred to as primary outputs and the internal output signals will be referred to as secondary outputs.

Thus, in FIG. 2, cycle-based design 200 is shown with three primary inputs (201, 202, and 203), three primary outputs (291, 292 and 293), three combinatorial blocks (210, 220 and 230), and six flip-flops (251–257). Signal lines 215, 216 and 217 are examples of secondary outputs, and signal lines 231–234 are examples of secondary inputs. It may be noted that if combinatorial block 220 needs an intermediate signal from block 210, it can still be modeled as shown in FIG. 2, by duplicating that logic in 220.

Even though only a single stage of combinatorial blocks is shown in FIG. 2, it should be understood that typical designs include several such stages. The manner in which the functional verification of cycle based designs can be performed in accordance with the present invention is described below in further detail.

4. Functional Verification of Cycle Based Designs

Figure 3C:
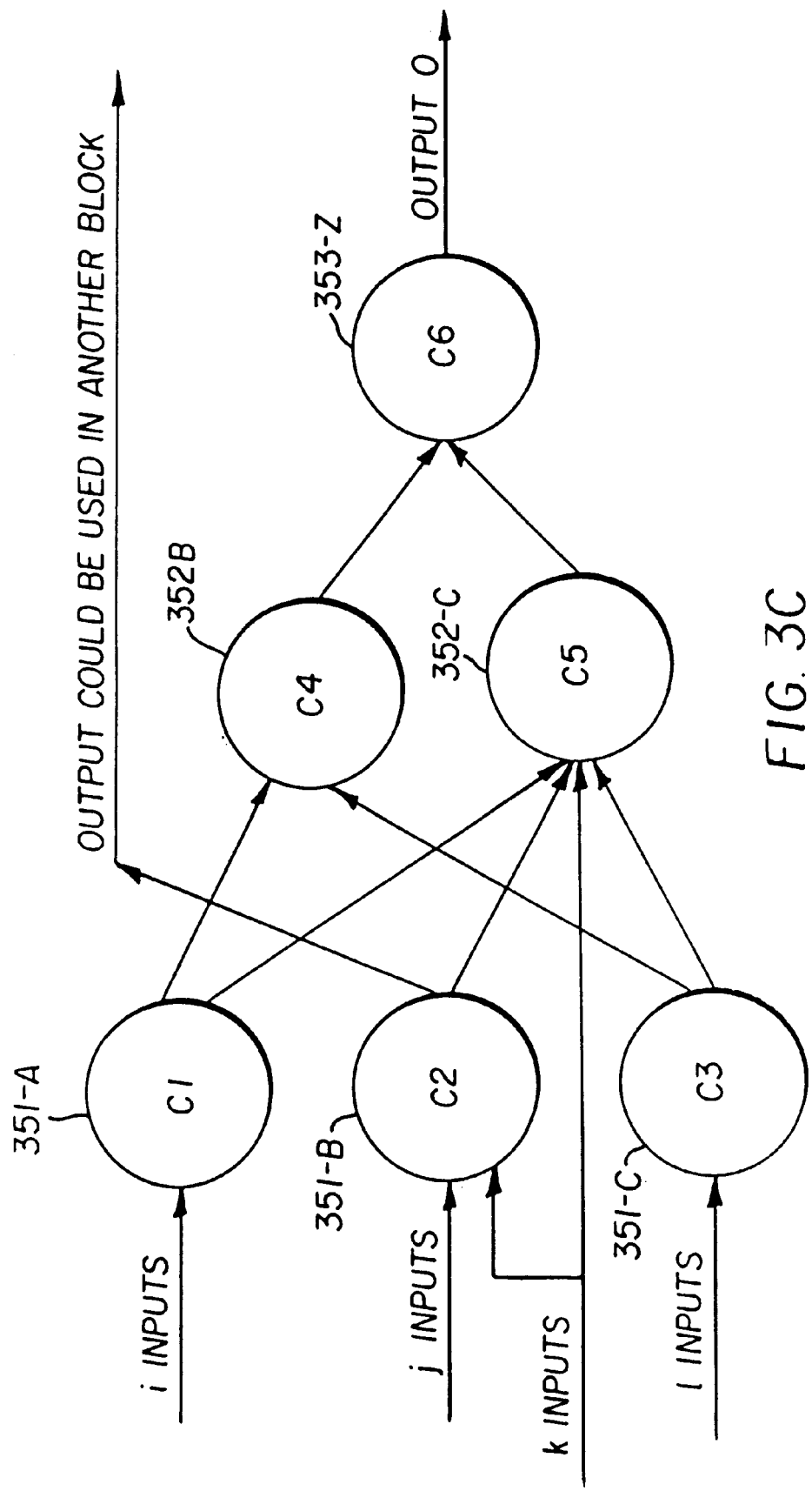

FIGS. 3A, 3B, 3C, and 3D are block diagrams illustrating the manner in which functional verification of cycle based designs can be performed in accordance with the present invention. With reference to FIG. 3A, a target design may be viewed as a combinatorial logic (truth table) 350 receiving several primary inputs 301 and generating several combinatorial logic outputs 398 and flip-flop outputs 399. The primary outputs typically include all outputs in 398 and potentially some of outputs 399.

A truth table with all outputs 399 and inputs 301 can be computed and the outputs 399 and 398 can be determined in a single verification cycle. However, the size of the truth table can become unmanageable even with target designs of reasonable sizes as noted above with reference to FIG. 1. Accordingly, combinatorial logic 350 is logically divided into several blocks as illustrated with reference to FIG. 3B.

Thus, in FIG. 3B, combinatorial logic 350 is shown logically divided into several blocks 351-A through 351-Z, 352-A through 352-Z, 352-A through 353-Z and 359-A through 353-Z. Interconnections typically exist between at least some of the blocks, and are illustrated with reference to FIG. 3C. The truth tables corresponding to each of these blocks are stored in a memory in accordance with the present invention. During functional verification, once the inputs of a block are determined, the determination of output may be performed in a single memory access as the truth table for the block is computed a priori. Accordingly, the determination of output values 398 and 399 for a given set of inputs (399 and 301) can be performed quickly in accordance with the present invention.

Continuing with reference to FIG. 3B, interconnect matrix 330 provides flip-flop output values 399 to the blocks (e.g., 351-A through 351-Z) as required according to the target design and the division scheme. Interconnect matrix can also be implemented in one of several ways. An example implementation of interconnect matrix 399 is described below.

FIG. 3C further illustrates the logical inter-connections of the blocks in an example scenario when truth table 350 is logically divided into the blocks of FIG. 3B. It may be noted that the outputs of some blocks are provided as an input to the other blocks, forming a dependency. The dependencies may force stages in the division of the blocks. Thus, 351-A, 351-B and 351-C may be viewed as in one stage ("first stage") as all of these three blocks can be evaluated in parallel. On the other hand, the evaluation of blocks 352-B and 352-C ("second stage") may begin only after the required blocks of the first stage are completed. The two blocks of the second stage may be evaluated in parallel. Block 353-C can be evaluated only upon the completion of evaluation of the two blocks of the second stage. 353-C is shown in the last stage.

In general, dividing combinatorial logic 350 into blocks having a small number of inputs leads to truth tables having a small number of entries, and the output of each block can be computed in a single memory access. However, the number of inputs needs to be sufficiently large so that the number of memory accesses to evaluate the outputs of combinatorial logic 350 is not unduly large. An example scheme for dividing the combinatorial logic 350 is described in the sections below.

The present invention can be implemented in one or more systems using a combination of hardware, software and firmware. Some example environments in which the present invention can be implemented are described below.

5. Example Embodiments in which the Present Invention can be Implemented

Figure 4:
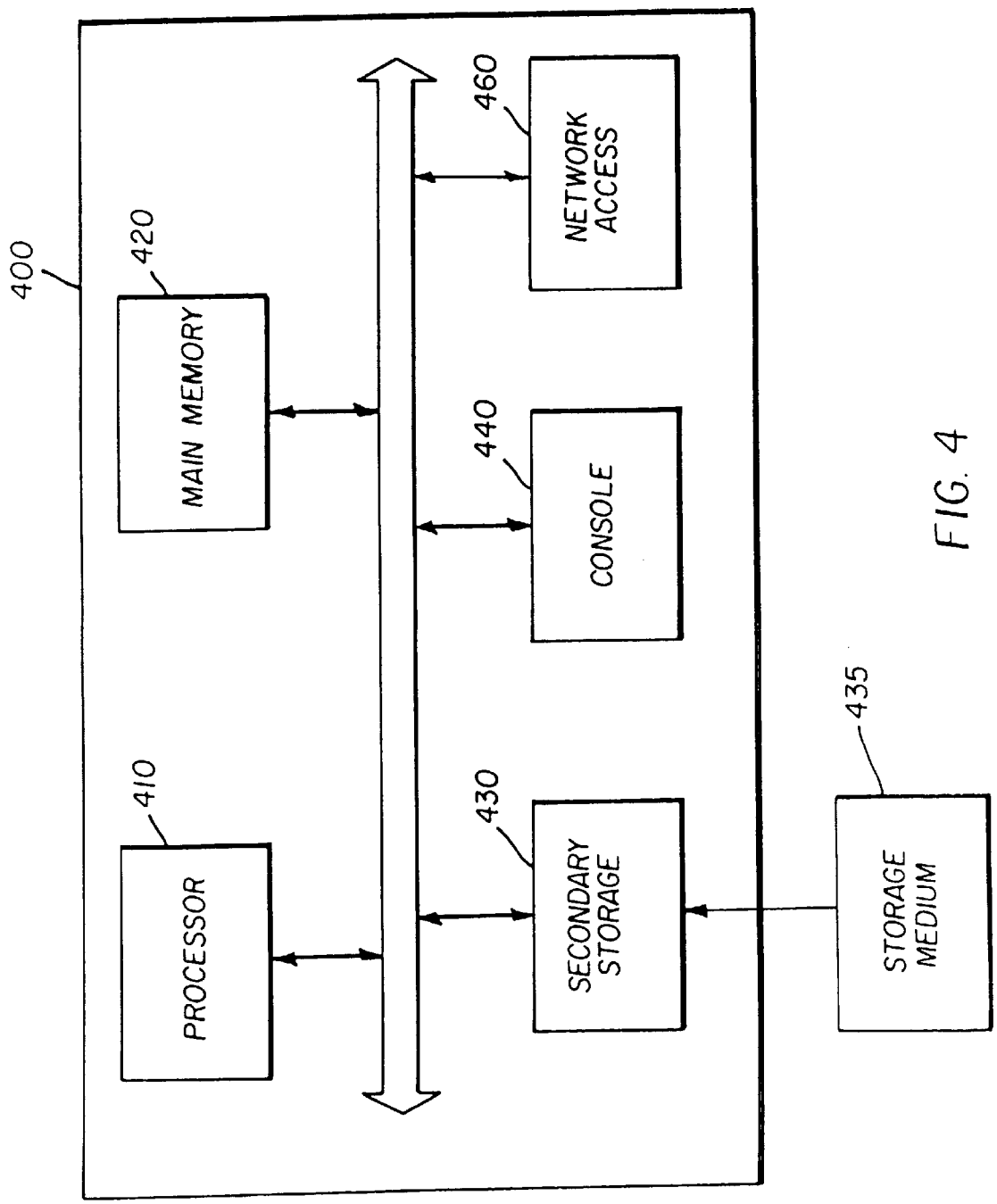
FIG. 4 is a block diagram of a computer system in which the present invention can be implemented.

FIG. 4 is a diagram of an example computer system 400 in which the present invention can be implemented. Computer system 400 includes processor 410 which executes instructions stored in main memory 420 to provide the features of the present invention. The instructions can be provided using secondary storage 430 or by transferring instruction data using network access 460. Tape drives, CD-Player, and hard-drives well known in the relevant arts are examples of secondary storage 430 and instructions and other relevant data can be provided using corresponding storage medium 435 (e.g., CD-ROMs). Network access 460 can be implemented using a dial-up connection or a network-interface-card communicating with a local area network.

The data from secondary storage 430 is transferred to main memory 420, and processor executes the instructions in the data to provide the features of the present invention. The program data represents controllers of computer system 400. Accordingly, the term "computer program product" is used to generally refer to a program stored in secondary storage 430. These computer program products are means for providing software to computer system 400.

The software implementation may be particularly suited in a simulation environment, in which the input data is typically also provided using secondary storage 430 and the output data of evaluation of a target design is also provided using secondary storage 430. The generated output data is compared with expected output data to determine whether the target design performs the functions it is designed to perform.

For speed of performance, multiple memory units can be chosen for main memory 420 and more than one processing unit may be employed in processor 410. Unfortunately, the verification speed possible using computer 400 may not be sufficient in, for example, verification environments. In a typical verification environment, the functional verification system is connected in a "real system" as described briefly in the section above entitled, "Background of the Invention".

In an alternative embodiment, multiple computer systems 400 connected by a network can be employed to implement the present invention. Each computer system 400 may process a portion of the target design, with proper inter-computer communication implemented for providing the outputs of some blocks as input to other blocks. Unfortunately, implementation using multiple computer systems 400 may be expensive. An alternative embodiment described below addresses the cost and throughput performance considerations as described below with reference to FIG. 5. The system there can operate in a verification environment and is accordingly referred to as verification system.

6. Verification System

Figure 5:
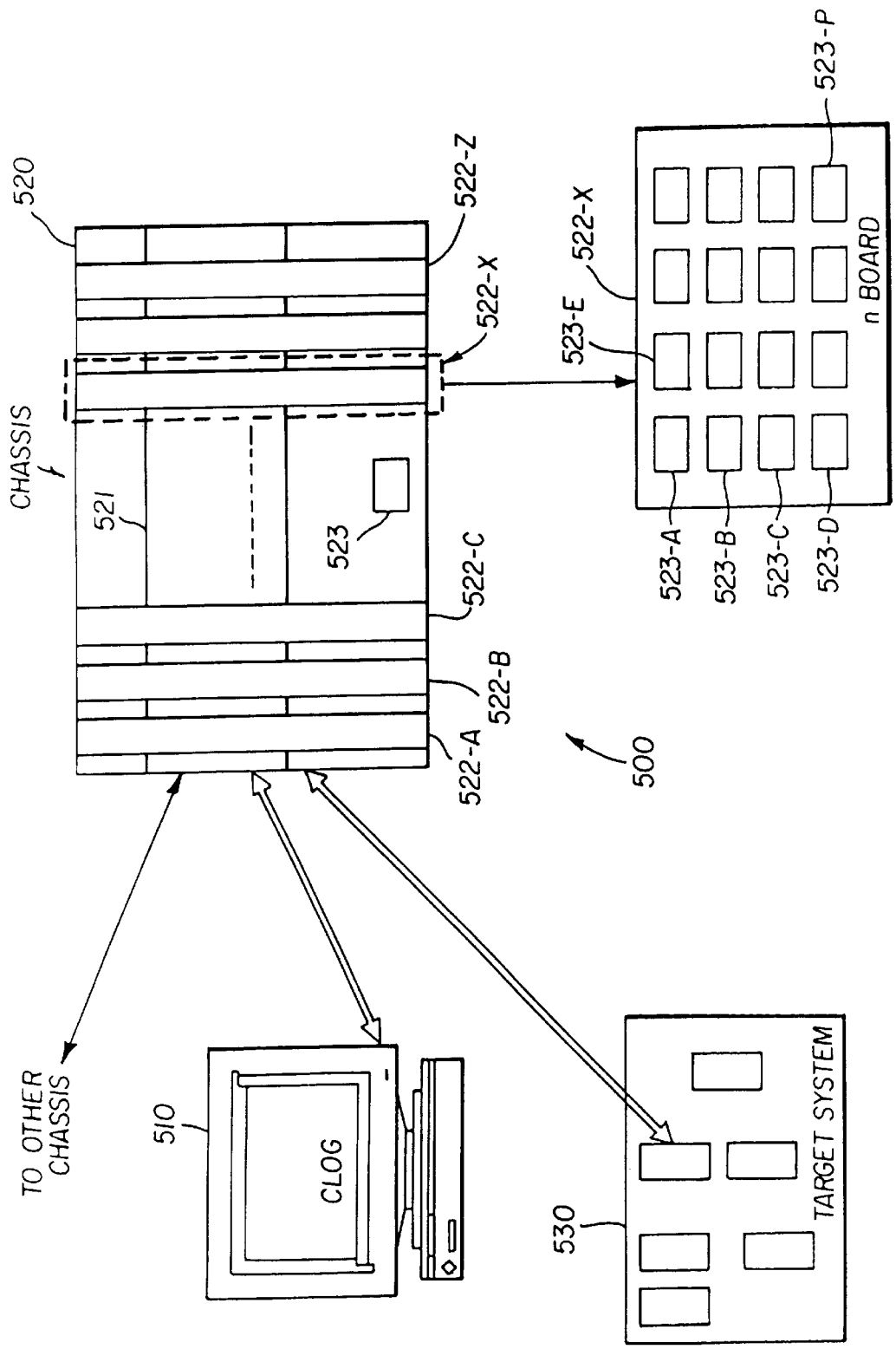
FIG. 5 is a block diagram of an embodiment of a functional verification system suitable for emulation environment implemented in accordance with the present invention.

An example embodiment of verification system 500 in accordance with the present invention is depicted in FIG. 5. For illustration, verification system 500 is shown in an emulation environment. However, the present invention can be implemented in other types of environments such as simulation environments.

Verification system 500 includes combinatorial logic output generator (CLOG) 510 and verification chassis 520 operating in conjunction with a target system 530. Typically, a target design represents one of the components of target system 520. Accordingly, some or all of the other components of target system 530 provide input data for the target design during functional verification. The output data generated during functional verification is again used by some or all of these other components. Functional verification of a target design can be performed in part by the accurate operation of target system 520 operating along with target system 520. In contrast, in a simulation environment, CLOG 510 provides input directly and examined output data of chassis 520 for verifying the functionality.

Combinatorial logic output generator (CLOG) 510 receives data representing a target design. A user wishing to perform functional verification typically provides the data. The target design is generally specified at a low level (e.g., at gate level) and data representing such low-level designs can be generated using one of several commercially available software packages (e.g., VHDL/Verilog or as a structural net list). CLOG 520 divides the target design into several smaller combinatorial blocks.

In general, the blocks need to be small enough such that a corresponding truth table can fit into a random access storage device (described below). In addition, the dependencies need to be taken into consideration for accurate operation. Accordingly, CLOG 510 controls the configuration of verification chassis to preserve dependencies among the partitioned blocks during the evaluation of a target design various input data. The manner in which CLOG 510 partitions combinatorial logic in an example embodiment is described in detail below.

Verification chassis 520 is configured according to the division performed by CLOG 510. Verification chassis 520 includes memory storage to store truth tables for the divided combinatorial blocks. The truth tables may be computed within verification chassis 520. Even though only one verification chassis 520 is shown in FIG. 5, it should be understood that multiple verification chassis may be employed to verify complex integrated circuits. Each verification chassis 520 may be viewed as including multiple verification units, with each verification unit evaluating one of more combinatorial logic blocks (as defined by CLOG 510). Communication scheme needs to be implemented among verification units to implement the dependencies in the target design. The communication typically needs to be intra-chassis and inter-chassis.

During the verification process, verification chassis 520 generates output data (primary or internal) corresponding to each state change in the target design. A state change may be caused either due to the logic implemented within a target design or due to changes in input data. The computation of the outputs of each change of state of the target design is generally referred to as a verification cycle. A verification cycle typically consists of a specified number of machine cycles, dependent on the target design and its mapping into the various CLOE units. A stage of a combinatorial logic can be evaluated in each machine cycle.

An example implementation of verification chassis 520 is described first, followed by CLOG 510.

7. Verification Chassis 520

Continuing with reference to FIG. 5, an embodiment of verification chassis 520 can be implemented by modifying one of many commercially available chassis in the market place. Verification chassis 520 may include one or more boards (shown as 522-A through 522-Z), back-plane system 521, and power and cooling system 523. Verification boards 522-A through 522-Z are described with general reference to 522-X. Verification chassis 520 may contain multiple slots, with each verification board occupying a slot. Each verification board 520 may contain multiple combination logic output evaluation (CLOE) blocks shown as 523-A through 523-P. Each CLOE operates as a verification unit of one or more logic blocks.

Power and cooling system 523 provides the electrical power to the remaining components and maintains the temperature of all the components within any desired temperature in a known way. Back-plane 521 provides the necessary connection between CLOEs on different verification boards 522-A through 522-Z, and between CLOEs on different verification chassis. The connections are used for inter-CLOE communication to implement various dependencies in the evaluation of a target design. Back-plane 521 typically provides a certain number of connectors for each verification board, and these connectors are used for inter-CLOE communication across multiple boards and across multiple chassis. In addition, each board includes connections between CLOEs (i.e., for intra-board communication).

The intra-board, inter-board and inter-chassis communications will be clearer based on an understanding of each CLOE. Accordingly, an embodiment of CLOE 523-A is described below.

8. Combination Logic Output Evaluation Block (CLOE) 523-A

CLOE 523-A evaluates a part of the combinatorial logic (in the form of one or more blocks) in a target system. To perform this evaluation function, CLOE 523-A may require one or more signals from two sources—the outputs of any other CLOE in the system from any of the previous machine cycle is one of the sources. The other being any of the primary inputs. Once the inputs are available, the blocks can be evaluated in a known way.

Figure 6:
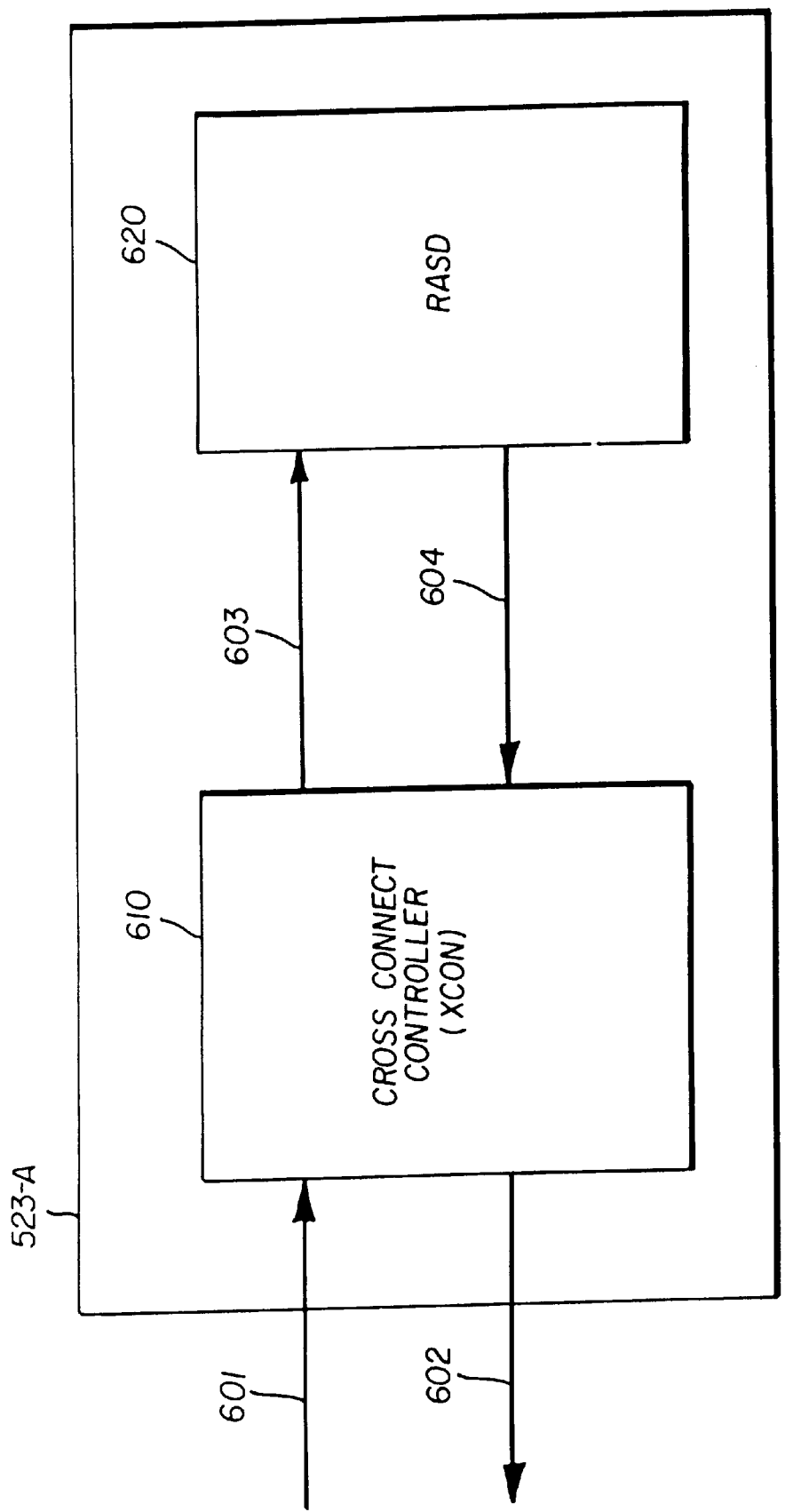
FIG. 6 is a block diagram of an embodiment of combinatorial logic output evaluator CLOE) illustrating the components therein.

FIG. 6 is a block diagram of CLOE 523-A illustrating an embodiment for implementing the above-noted scheme. CLOE 523-A includes XCONcontroller 610 and random access storage device (RASD) 620. RASD 620 stores the truth tables corresponding to various blocks to be evaluated by CLOE 523-A. Cross-connect controller 610 provides for communication with the remaining CLOEs in verification system 500. Bus 601 provides for communication with CLOEs in the same verification board and bus 620 provides for communication with CLOEs in other verification boards and for receiving primary input values.

The manner in which communication can be facilitated between different CLOEs is described first. Example implementations of XCONcontroller 610 and RASD 620 are described next. The manner in which truth tables can be stored in RASD 620 for efficient retrieval is described next. The details RASD 620 and XCONcontroller 610 in several example embodiments will be clear from these descriptions.

9. Interconnecting CLOEs

Figure 7:
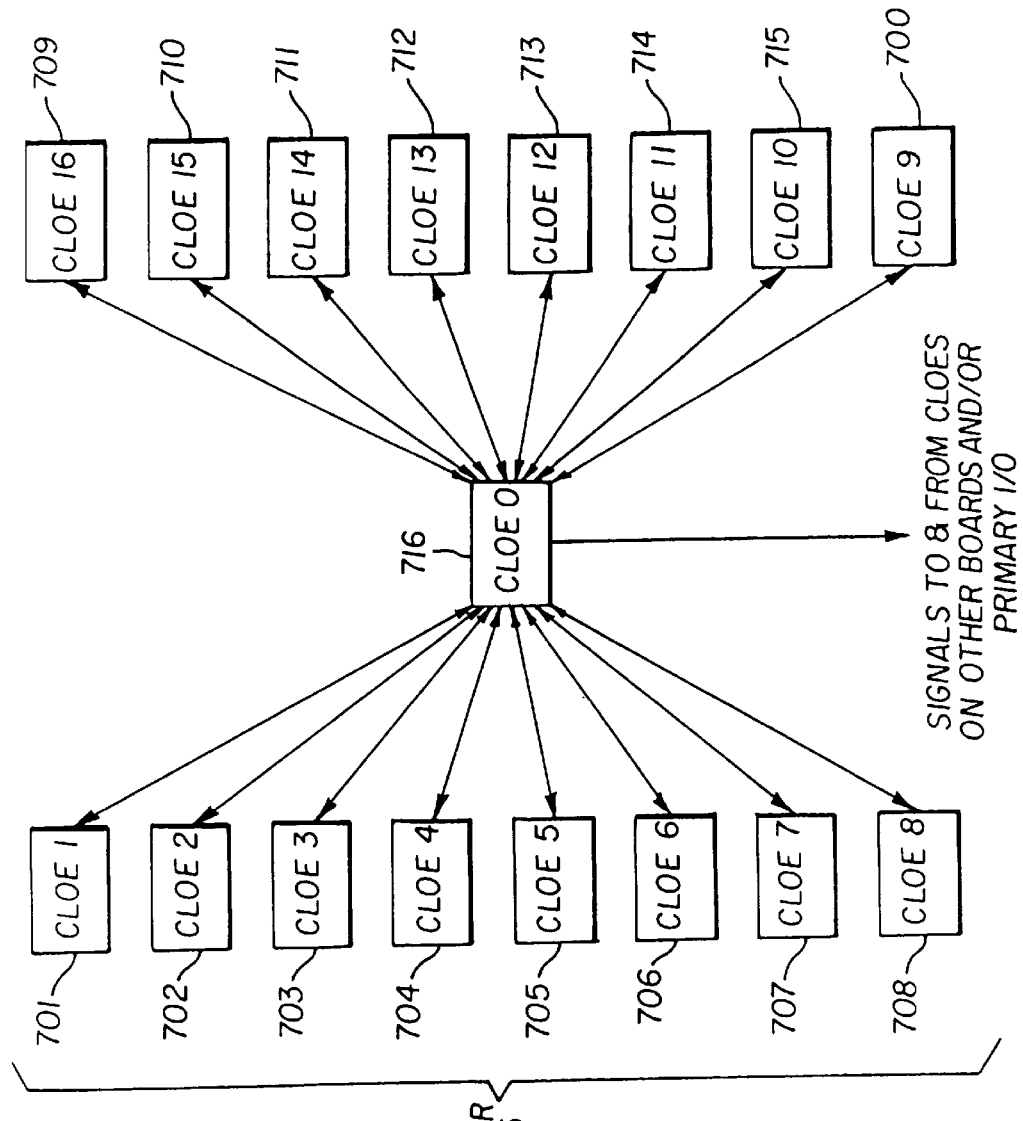
FIG. 7 is a block diagram of interconnecting multiple CLOEs illustrating one way in which inter-CLOE communication can be facilitated.

One way to interconnect CLOEs is to have a fully connected mesh of CLOEs. As this fully connected mesh scheme becomes exponentially large with the number of CLOEs in the system, a more practical alternate scheme is described with combined reference to FIGS. 6 and 7. FIG. 7 illustrates a hierarchical fashion for interconnecting different CLOEs. For illustration, seventeen CLOEs referred by 700–716 are shown. In general, a CLOE has a certain number of signals to connect to a specified number of other CLOEs. These CLOEs that have a direct connection between them will be referred to as 'neighbors'.

For example, with reference to FIG. 6, bus 601 may include 256 signal lines, with eight signal lines being used for sending to (and eight more signal lines for receiving from) each neighbor. Therefore, each of CLOEs 700–716 is connected to other sixteen CLOEs by sixteen signal lines, eight for receiving data and eight for sending data. Neighbors (or adjacent CLOEs) can exchange signals between each other in one machine cycle. CLOEs that are not neighbors but on the same verification board exchange information by propagating the signals in multiple machine cycles through the neighbors.

CLOEs on different verification boards can exchange information using another group of signals. In an embodiment, this group of signals is also used for input and output of the primary signals from the target system. For example, with combined reference to FIGS. 6 and 7, bus 602 may include 32 signal lines for connecting to primary inputs or to communicate with CLOEs in other modules or for receiving primary input/output values. Thus, when CLOE 710 needs to communicate with (either send output value or receive output value) a CLOE in another board, CLOE 716 ("central CLOE") operates as an intermediary for the communication. Central CLOE 716 communicates with CLOEs on other boards using back-plane 521.

From the above, it may be noted that central CLOE 716, can be used for inter-CLOE communication which is either inter-board or inter-chassis. On the other hand, for intra-board communication, CLOEs 700–716 can communicate with each other using dedicated buses.

Using an interconnection scheme such as that described with reference to FIG. 7, CLOEs 523-A through 523-P perform functional verification. The manner in which the dependencies can be preserved using the intra-CLOE and inter-CLOE communication will be clearer from a description of an example implementation of XCON 610 and RASD 620.

10. Cross-Connect (XCON) 610

As may be apparent from the above description, XCON 610 is the component responsible for controlling the actual evaluation in the verification system during a verification cycle. The two main functions of XCON are: (1) to control a specified number of RASD 620 devices by providing address, select and control signals to the appropriate RASD during the appropriate machine cycle, and (2) to provide a mechanism to connect the data outputs from the controlled RASD units to other XCONs in the verification system while maintaining data dependencies.

As described below in detail, each RASD 620 can store the output values of multiple truth tables. In accordance with an aspect of the present invention, the output values may be stored in storage locations having addressed formed based on the input data values. As the availability of the input data values is generally a pre-condition to evaluation of any block, the address for accessing a storage location can be computed immediately upon the availability of the input data values. As will also be apparent to one skilled in the relevant arts, the address bits can potentially be used immediately upon being generated as output of combinatorial blocks.

Figure 8:
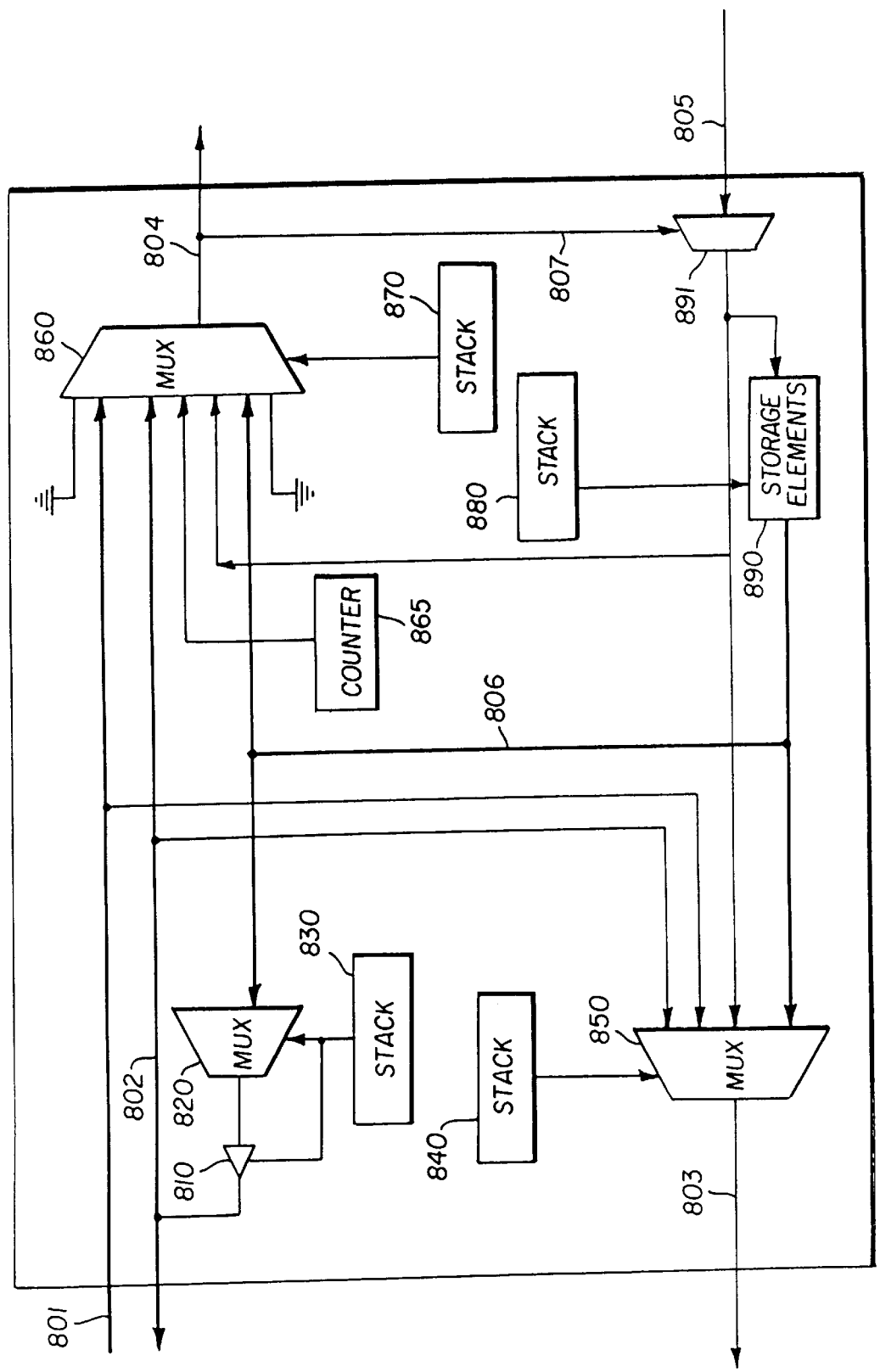
FIG. 8 is a block diagram illustrating the internal structure of an XCON module which preserves dependencies and facilitates block evaluations to be performed by memory accesses in accordance with the present invention.

FIG. 8 is a block diagram illustrating an example implementation of XCON 610. It may be noted that the general architecture described here may be used to implement a central CLOE 716 or adjacent CLOEs. XCON 610 includes tri-state buffer 810, multiplexors 820, 850, 860 and 891, stacks 830, 840, 870 and 880, and storage elements 890. Each component is described in detail below.

Bus 801 may include 128 signal lines, with 8 signal lines for receiving data from each of the 16 neighbors (see, FIG. 7). Bus 802 may also include 128 signal lines, with 8 signal lines for sending data to each of the 16 neighbors. Buses 801 and 803 may be used for intra-chassis communication. Bus 802 may include 32 signals lines from other chassis (intra-chassis communication) and primary input/output lines. Bus 804 may include 120 address signals to RASDs. Bus 805 may include 64 signal lines (from 8 RASDs) for receiving data representing the outputs of the evaluated combinatorial blocks.

Stacks 830, 840, 870 and 880 are setup with proper values by CLOG 510. A stack generally refers to a block (implemented in a combination of hardware, firmware and software, like other blocks in the verification system) having a sequence of control words. The content of each word controls a corresponding block in a pre-defined way. The sequence of the words, in combination, is designed to maintain desired data dependencies (and timing in terms of machine cycles) while evaluating different combinatorial blocks. That is, CLOG 510 determines when an output of a combinatorial block (or primary input) will be available during verification, and setup the stacks to ensure that the data dependencies are maintained consistent with the target design. Each stack may thus be viewed as a controller of the corresponding device. For example, stack 840 may be viewed as a multiplexor controller. The manner in which the values are used in maintaining dependencies will be clearer from the description of the other components.

In addition to preserving dependencies, the values in the stacks may be stored to exploit any parallelism possible in the evaluation of blocks. For example, with combined reference to FIGS. 3 and 8, blocks in each stage (e.g., blocks 351-A, 351-B and 351-C) may be setup for evaluation in parallel in a single machine cycle. However, the actual practicability of parallel evaluation often depends on the data organization in different RASDS and other hardware needed to take advantage of such parallelism. Some optimization techniques which enable several parallel evaluations are described below in further detail.

Continuing with reference to FIG. 8, multiplexor 860 is controlled by the output of stack 870, and operates to generate addresses for RASDs coupled to bus 804. In an embodiment, bus 804 includes 120 address lines, with 15 address lines being provided to each of 8 RASDs. The address signals provided by the XCON to RASD 620 can be selected every machine cycle from one of the following six sources as specified by a control word from stack 870:

a) inputs from any of the neighboring XCONs (on bus 801) (For example, in a system with 16 neighbors each with 8 signals, this would be 128 signals);

b) any of the data outputs read from it's storage units 890 (bus 806) on any of the previous cycle.

For example, in a system with 256 storage elements, this would be 256 signals;

c) any of the data outputs read from RASD 620 (on bus 805) in the just completed cycle. For examples in a system with 8 bits from 8 RASD units, there would be 64 signals;

d) any of the signals from the adjacent modules or primary inputs (on bus 802);

e) function number of the function being evaluated, if there are more than one function mapped to RASD 620;

f) counter 865, the operation of which is described below.

This selection can be different for each of the machine cycles. The selection is based on a stack of evaluation control words 870, setup by the CLOG at the start of the verification run. The stack is generally of the same size as the number of machine cycles in a verification cycle. The width of each of the control words in the stack may be log 2N, where N is the total number of all the signals listed in items a through e above.

Multiplexor 891 receives multiple bits of data in an access unit (e.g., word or byte) of a memory location on bus 805, and selects one of the bits which corresponds to the desired output value. The desired output value may be specified as a part of the address bus 804. As will be clearer from the various storage schemes described with reference to FIGS. 12–15, 16A and 16B, a received access unit may include multiple desired output values (evaluated in parallel). Multiplexor 891 may include multiple multiplexors equal in number to the number of parallel evaluations possible with a single memory access.

Local storage 890 stores some of the output values which may be needed during subsequent machine cycles. For example, an output value may be provided on line 806 as an address bit to multiplexor 860 or to an external XCON, or as a primary output value during a later machine cycle. The data in stack 880 (configured by CLOG while dividing a target design) determines the entries which are output on line/bus 806 during a given machine cycle.

Multiplexor 850 and stack 840 operate to generate signals (data values) to be transferred to a neighboring (adjacent) XCON within the same chassis. The signals provided by any XCON to it's neighbor can be selected every machine cycle from one of the following four sources:

a) inputs from the neighbors on bus 801 (to provide a means for propagating signals through a number of XCONs, used for example, in intra-chassis communication);

b) any of the signals from the verification module neighbors on bus 802;

c) any of the data outputs read from RASD 620 array on any of the previous cycle and stored in the local storage 890; and d) any of the data outputs read from RASD 620 array in the just completed cycle (on bus 805).

This selection again can be different for each of the machine cycles. The selection is based on control words in stack 840 setup by the software at the start of a verification run. The stack would be of the same size as the number of machine cycles in a verification cycle. The width of each of the control words in the stack may be log 2N, where N is the total number of all the signals listed in items a) through d) above.

Multiplexor 820 and stack 830 operate to provide output values to XCONs in other boards or chassis (i.e., inter-board communication). Tri-state buffer 810 enables bus 802 to be shared for both receiving and sending data. Tri-state buffer 810 can be implemented in a known way. Multiplexor 820 receives output values from storage elements on bus 806, and stack 830 controls multiplexor 820 and tri-state buffer 810 to cause a desired output value to be provided on bus 802.

Counter 865 is programmed by a value by CLOG, and the value is used when several small functions are packed into a RASD. To clarify, in general an address of a location in a RASD is formed by the output values of combinatorial blocks or primary inputs. However, when combinatorial blocks with a small number of inputs are stored in a RASD, several such functions can be stored in a RASD for optimal usage of the storage space. Under such circumstance, the value can be used for generating the complete address. Counter 865 may also be implemented as a stack to be able to provide different values during different machine cycles.

Using the output values received and the value in counter 865, multiplexor 860 located in each XCON forms addresses for retrieving new output values. At least some of the retrieved new values represent the output values of the evaluated blocks. The manner in which the addresses can be used for fast and efficient evaluation of blocks is described in further detail below.

Thus, from the above description it may be appreciated that XCON 610 provides addresses to RASD 620 on bus 804, and the data provided in response on bus 805 represents the output of evaluation of a block assigned to RASD 620. The below description of an embodiment of RASD 620 further clarifies a manner in which the data corresponding to various truth tables can be stored for efficient operation of verification system 500 in accordance with the present invention.

11. RASD 620 in an Embodiment

RASD 620 is generally a memory device that provides a means for random access to its contents. Typical devices that fall into this category are SRAM, SSRAM, DRAM, SDRAM, SGRAM, FLASH, EPROM. RASD 620 is used to store the truth table for any given combinatorial function that needs to be evaluated. By using the inputs to the combinatorial function as the address lines to RASD 620, one can perform the evaluation by reading the data stored in the truth table. The address lines to RASD 620 are controlled by XCON 610. The evaluation output from RASD 620 is used by XCON 610.

For a high throughput performance, an embodiment of the RASD 620 is implemented using a static Random Access Memory (SRAM) having 32K locations, with each location having 8 bits. A single XCON would control 8 rows of 4

RASD banks, for a total of 32 RASDs. By using RASDs that have an access time of 12 Ns (nanoseconds) a single access and exchange of information between neighboring CLOEs can be very easily accomplished in 25 Ns. This translates to a machine cycle of 25 Ns and a system frequency of 40 MHZ. With 4 banks of RASDs each with 8 bits, the maximum number of machine cycles needed to evaluate all of the functions is 32 (4×8). This translates to 32×25 Ns=800 Ns for every verification cycle. Allowing another 200 Ns of inter-connect delay time between verification boards and verification chassis, it may be noted that the total time taken for one verification cycle is 800+200 Ns=1000 Ns. This translates to 1 MHZ of verification speed.

XCON module 610 operating with such a RASD could then read up to 64 bits of logic output from the RASD array every machine cycle. A single XCON would have 16 immediate neighbors to which it has 8 input and 8 output connections per neighbor. Data transfer between these XCON modules can happen in one machine cycle. Each XCON also has 32 connections that can be configured as input or output. These are used to either inter-connect verification boards or to connect to the target system's primary input/output. To emulate memory in the target system, one or more of the XCONs can be configured to treat the RASD(s) as a memory element instead of logic output blocks. The XCONs used to emulate memory could use DRAMs instead of SRAMs to achieve more density, such as the commonly available 8M×8 device. This would allow a single XCON to emulate a total of 256 MB of target memory.

Figure 9:
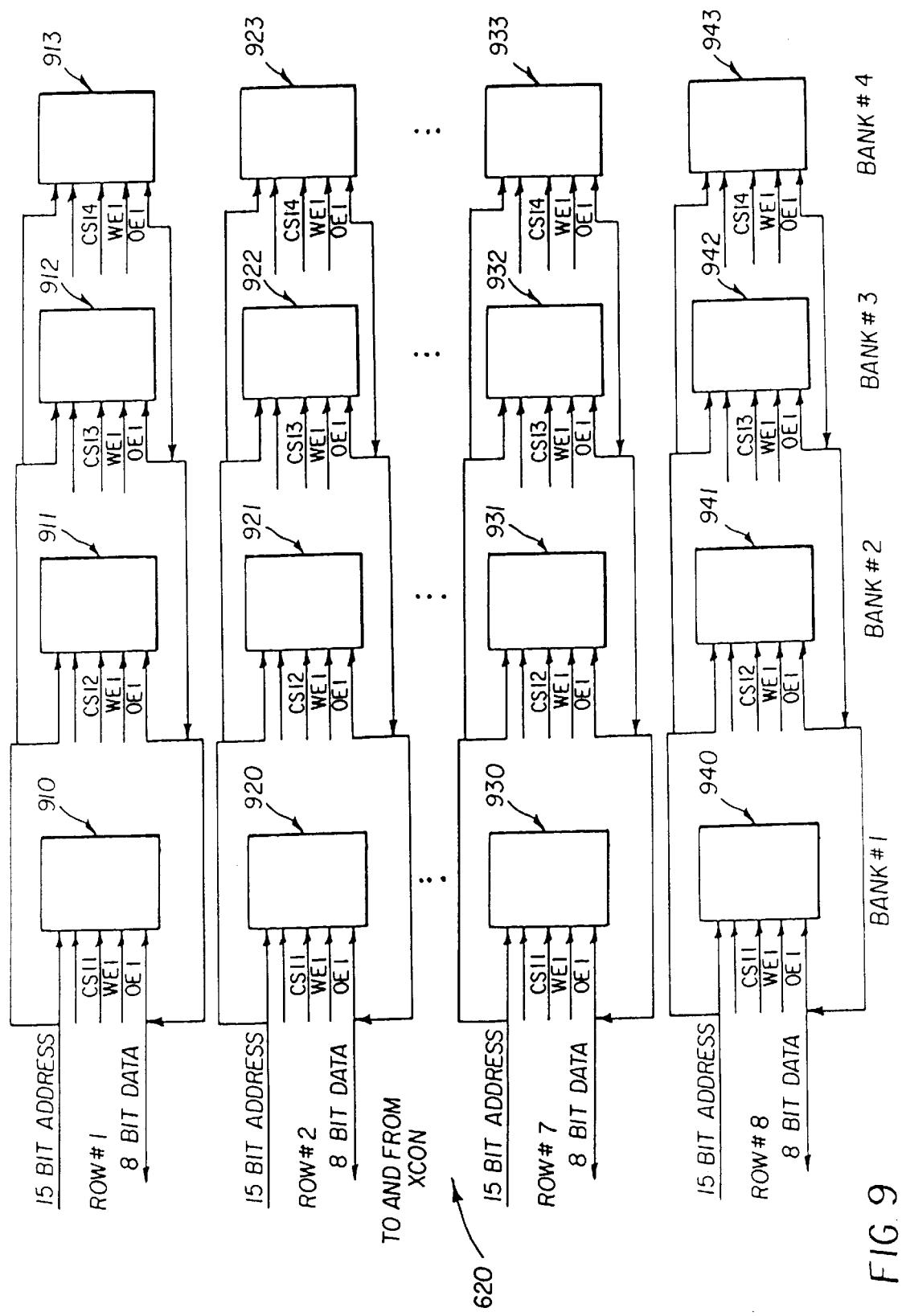
FIG. 9 is a block diagram illustrating the internal structure of a random access storage device (RASD) in an embodiment of the present invention.

FIG. 9 is a block diagram of an example implementation of RASD 620. Memory units 910–913 are shown in row 1, memory units 920–923 are shown in row 2, memory units 930–933 are shown in row 3, and memory units 940–943 are shown in row 4. As may be noted, RASD 620 is implemented as a two dimensional array of rows (horizontal) and banks (vertical) of individual memory units that are all controlled by the same XCON device. All memory units in a row have the same address line and data line connections from XCON 610 that controls them. Therefore, during any machine cycle, only one memory unit can be active in any given row. In contrast, all memory units in a bank are accessed in parallel by XCON 610. Thus, a XCON controls 'r' rows of 'b' banks of storage devices. Hence RASD 620 in the form of an array is controlled by a single XCON.

Each of the memory units accepts a 15-bit address and generates the corresponding data related to a truth table on the corresponding output line. Also, a memory unit with 'N' address input signals typically has 2N locations. Commercially available memory units are multiple bits per location. For illustration it will be assumed that the device has 'w' bits per location. Having 'w' bits per location allows all the 'w' bits of information to be accessed in a single read cycle. Using an architecture such as the one described above with reference to FIG. 9, different data organization techniques can be employed within the memory units of RASD 620** for a quick evaluation of the blocks assigned to corresponding CLOE as described below.

12. Evaluation of a Block Representing a Function in General

Figure 10:
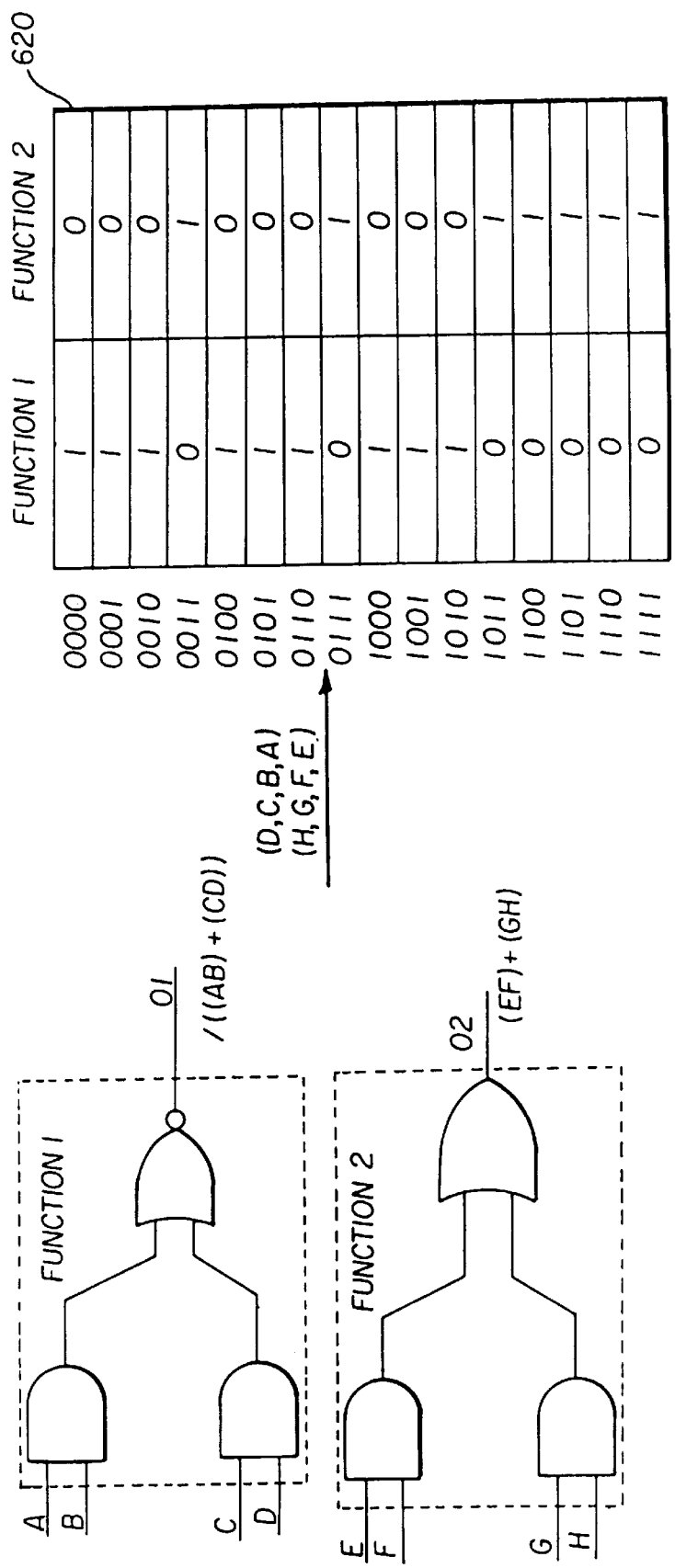
FIG. 10 is a block diagram illustrating the manner in which output data for a function is stored in an embodiment of the present invention.

FIG. 10 illustrates by means of an example how the truth table values stored for different functions (combinatorial blocks) can be used during functional verification. The example shows two 4-input functions mapped onto RASD 620 that has 16 locations each being 2 bits wide. RASD 620 is initialized (e.g., by software implemented in CLOG 510) with the truth table(s) for the combinatorial function(s) that RASD 620 would verify (emulate). During the first machine cycle, RASD 620 would be presented with (by XCON 610) the current state of the inputs for function #1 (A,B,C,D). This would read the location that corresponds to the state of the inputs thus evaluating the function. The output from RASD 620 is latched internally by XCON 610. In the second machine cycle the current state of the inputs for function #2 are presented to RASD 620 by XCON 610 (E,F,G,H). The second function is thus evaluated.

In general, there is a great flexibility in terms of how combinatorial functions are mapped to a particular RASD. It is not only possible to use different mapping schemes for different RASDs in the system, it is also possible to use different schemes for each of the different 'w' bits with in RASD 620. Each of the different schemes optimizes for the verification speed or the gate capacity that can be supported by the verification system. Some examples of the schemes are described in detail in the following sections.

13. Organizing Truth Table Output Data in Memory for Efficient Evaluation

One scheme ("scheme 1") to distribute combinatorial functions (in the target design) among RASD 620 units is to store one function in each of the 'w' bits of every RASD in the system as illustrated with reference to FIG. 11. Thus, a RASD with 'w' bits would hold 'w' functions, each with at most 'N' inputs. For a configuration with 'r' rows of 'b' banks of a RASD array, the number of combinatorial functions that can be stored is given by the following equations:

Number of functions stored in a RASD unit='w'

Maximum number of inputs to these functions='N'

Number of functions in a RASD array=w·r·b

Number of functions in the entire system=w·r·b·a where 'a' is the total number of RASD arrays in the system If the target design can be partitioned in such a manner that all the combinatorial functions that need to be evaluated have close to 'N' inputs, then the above mentioned scheme for partitioning would be effective. For functions that require less than 'N' inputs, the unused inputs could be permanently driven inactive by XCON 610. In these cases, where the number of inputs to the combinatorial function is less than 'N', the unused bits would result in unused locations (shown as 1120) in RASD 620 as shown in FIG. 11.

Every machine cycle, XCON 610 provides a new 'N' bit address to each of RASD 620 units in a bank. RASD620 provides all the 'w' bits in the addressed location back to XCON 610. The control stack (along with multiplexor 891) in XCON 610 (which is initialized by CLOG) indicates to XCON 610 which one bit of the 'w' that are output by RASD 620 represents the combinatorial function that is being evaluated in that particular machine cycle. XCON 610 would then store that particular data bit in local storage 890, which can then be used as address for a subsequent machine cycle if needed. This latched bit can also be shared with the other XCONs in the system through the inter-connect network (by transferring on buses 802 and 803 of FIG. 8).

Figure 11:
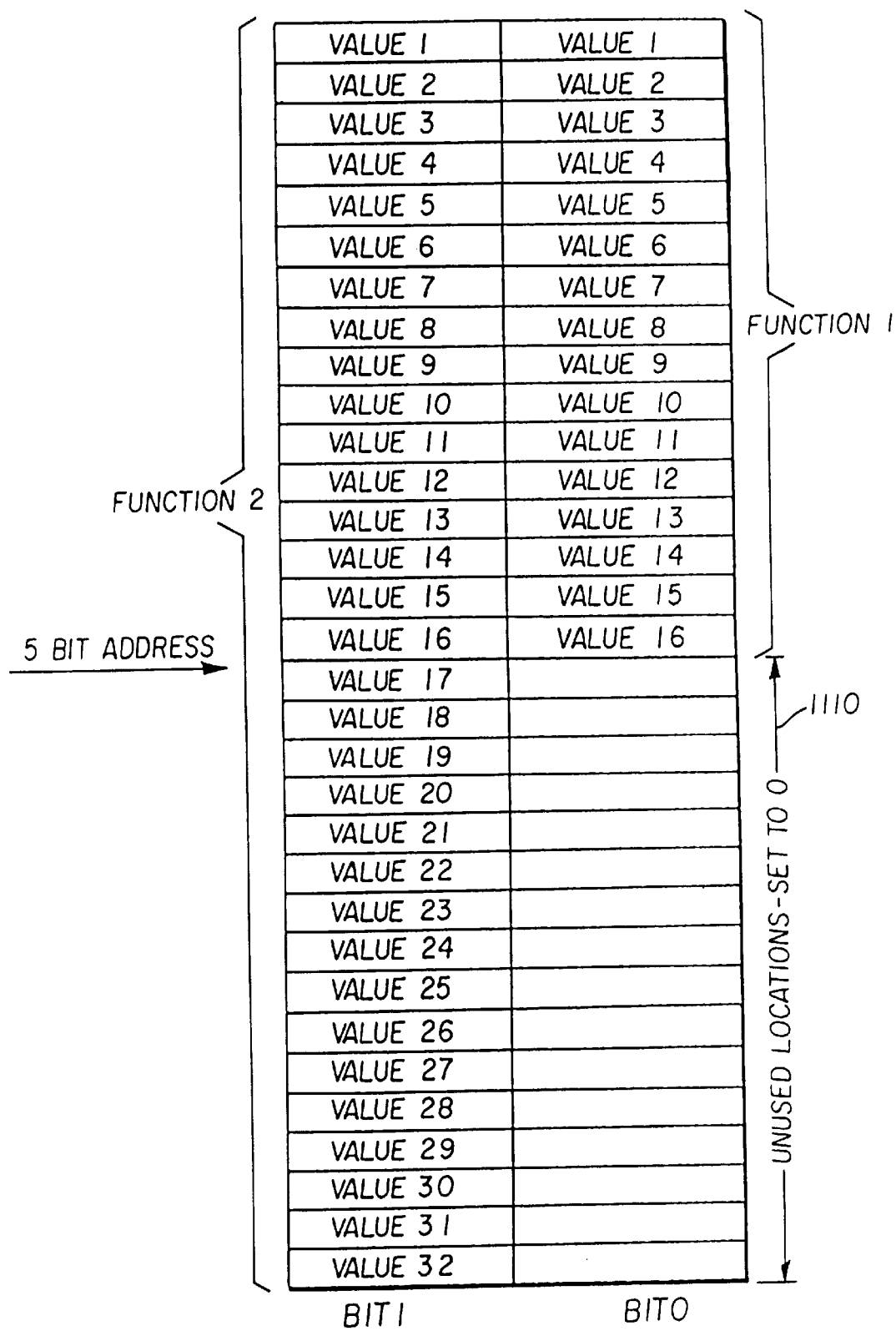
FIG. 11 is a diagram illustrating how memory space can be utilized efficiently while storing output values of several functions in a RASD.

Continuing with reference to FIG. 11, the number of machine cycles needed in this case to evaluate all of the w*r*b*a functions in the system is w*b machine cycles. The 'a' XCONs in the system are evaluating 'r' rows of RASD in parallel in a single machine cycle.

It can be shown that a combinatorial function with 'N' inputs is equivalent to at least (N–1) two-input gates. Though this is the theoretical minimum number of 2 input gates that can be represented by a 'N' input function, statistically as 'N' increases, this number is much larger than N−1).

Thus, the above scheme would be capable of emulating a target system with a theoretical minimum of w*r*b*a.(N−1) gates, if all the combinatorial functions were of 'N' inputs. If the combinatorial functions needed on the average N/2 inputs, then the total number of gates that can be emulated would be w*r*b*a.(N/2−1).

In the scheme of FIG. 11, XCON 610 would provide RASD 620 with a different set of 'N' input values in each of the machine cycles. That is, one function (block) is evaluated in each memory access (or machine cycle). In addition, if a function uses lesser than N inputs, some of the memory locations may not be used. Thus, function 2 is shown with five inputs and using all 32 locations in FIG. 11, while function 1 is shown using only half the memory locations. The remaining half memory locations (shown by numeral 1110) are shown unused. FIGS. 12A and 12B illustrates a way in which the drawbacks can be addressed.

FIG. 12A illustrates a scenario in which two functions 3 and 4 use the same inputs. Both functions operate from the same five inputs. Assuming a location width of 'w', a speedup of w can be achieved in comparison to the scheme of FIG. 11. That is, 'w' functions can be evaluated in a single machine cycle. The condition required to get this speed up, is for the software (i.e., COGS 510) to identify all the appropriate combinatorial functions in the target design and locate them in the same RASD. In some situations, a function may use a subset of the inputs of another function. In that case, a speedup of 'w' can still be achieved, but at the expense of storage density as illustrated with reference to FIG. 12B.

FIG. 12B includes two functions 5 and 6, with function 5 having 5 inputs (32 output values in the corresponding truth table), and function 6 having only four inputs (16 values in the corresponding truth table). As shown, each output value of function 6 is replicated in locations in which the address lines identifying function 6 are shared by function 5 also. Assuming the most significant bit is the only non-shared bit, CLOG configures stack 670 such that the most significant bit is always determined by the input of function 5.

In the previous two schemes of FIGS. 12A and 12B, RASD 620 usage was optimal only if the combinatorial functions needed close to 'N' inputs. It may not be possible for CLOG 510 to always partition the target designs into 'N' input functions. In cases where there are functions that are less than 'N' inputs mapped to a RASD, that particular RASD may have a lot of locations that are not being utilized, leading to a less optimal solution. If a function with 'M' inputs is mapped (M<N) to a RASD with 2N locations, then only 2M locations are actually used and 2**(N−M) locations of RASD 620 are wasted. This wastage of RASD locations will lead to reduced gate that a given RASD configuration can support. The problem of unutilized locations in RASD 620 can be overcome, for a trade-off in verification speed, as described below with reference to FIG. 13.

Figure 13:
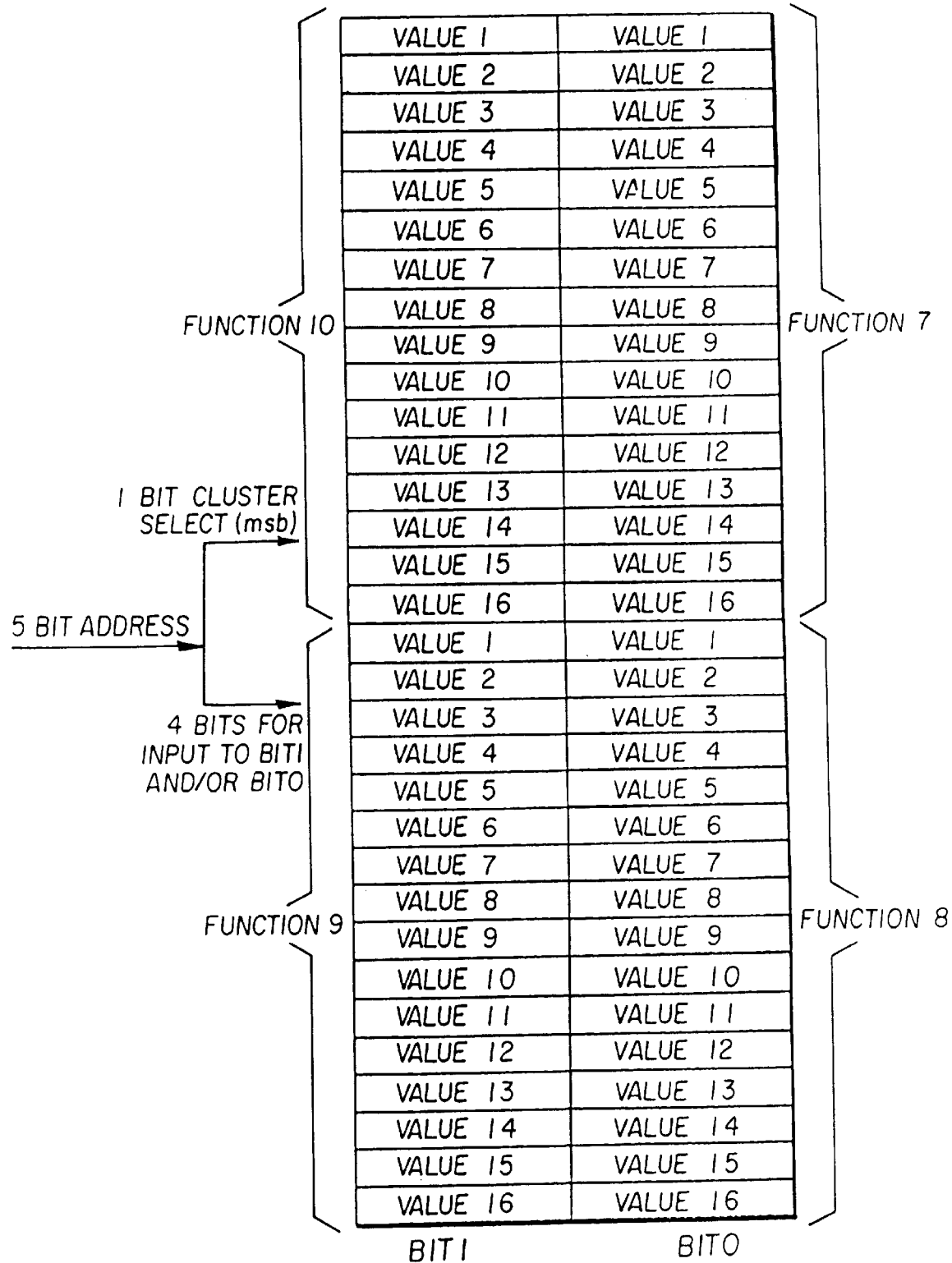
FIG. 13 is a diagram illustrating the manner in which the truth table output data can be stored when the blocks use less number of inputs than the number of address lines in a RASD.

With reference to FIG. 13, the output values for four functions 7–10 are shown stored. Of the five address bits used in FIG. 13, one value of the most significant bit may identify the cluster of functions 7 and 10, and the other value may identify the other cluster of functions 8 and 9. Within a cluster, 4 bits may be needed to select a word (access unit) of RASD. Once a word is selected, multiplexor 891 of FIG. 8 may select one of the desired words. In this scheme, only one desired output value may be accessed in each access or machine cycle.

In general, if the combinatorial functions mapped to a RASD need 'M' inputs (M<N), then the unused address bits to RASD 620 (N−M bits) can be used as 'function selectors'. These (N−M) bits can be used to address 2**(N−M) different functions, each with 'M' inputs. Note that even if (N−M) was 3 bits, this scheme can store 8 times the number of combinatorial functions as compared to Scheme 1. This scheme leads to the following equations for the total number of functions supported.

Number of functions per RASD=w·2**(N−M) each with up to 'M' inputs.

As noted above, the trade-off for storing multiple functions, to gain better utilization of RASD 620, may be the decrease in the verification speed. For the above example the number of machine cycles needed to evaluate all the functions is w·2**(N−M) instead of just 'w' as in FIG. 11.

Figure 14:
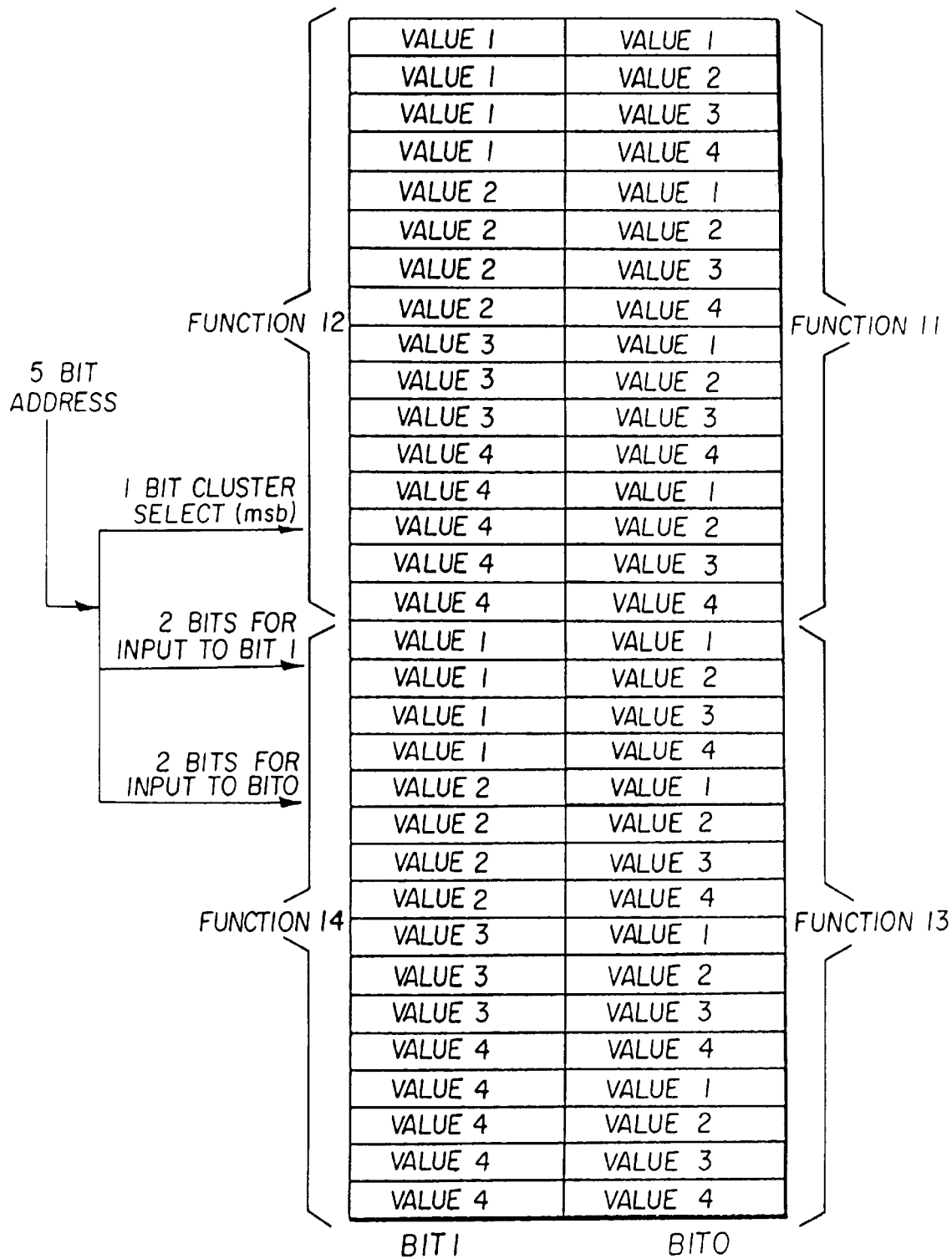
FIG. 14 is a diagram illustrating the manner in which multiple blocks can be evaluated in parallel when one block requires a subset of inputs of a second block.

FIG. 14 illustrates the manner in which the schemes of FIG. 12 and 13 can be merged, yet retaining increase in density of gates offered by the scheme of FIG. 13. In the scheme of FIG. 14, functions 12 and 11 have two disjoint input bits, and functions 14 and 15 have another two disjoint input bits. The output values of all the functions are replicated four times to enable two functions to be evaluated in a single memory access. That is, both functions 12 and 13 (or functions 13 and 14) can be evaluated in a single memory access. Once a word including the two desired output values are selected, multiplexors 891 enable individual bits to be used in a desired manner according to the control words received on bus 807.

CLOG may try to use this scheme where ever possible since it optimizes for both speed and density. The 'N' inputs that are supported by RASD 620 in the system can be divided into (N−M) bits of function selectors (as in FIG. 13). The remaining 'M' inputs can be further divided into a maximum 'w' groups of inputs with N1, N2, N3 . . . Nw number of inputs respectively. The conditions that needs to be satisfied are N1, N2 . . . Nw are all less than M.

Sum of the unique inputs in N1 through Nw has to be less than or equal to M.

Let us consider an example to clarify the above scheme. Let us assume that N is 15, M is 12 and w is 8. This corresponds to a RASD of the configuration 32K locations each of which are 8 bits wide. Some of the possible combinations are three disjoint (no function shares any input with any other function) 4-input functions, four disjoint 3-input functions, two disjoint 6-input functions, one 12-input function or eight 4-input functions all of which have inputs that are a proper subset of the 12 possible inputs.

With this mapping, we can store the function that has N1 inputs in data bit D1 of RASD 620, function that has N2 inputs in data bit D2 and so on until Dw which stores the function that has Nw inputs. Since the 'w' bits of RASD 620 can be accessed in parallel, 'w' functions each with N1, N2, N3 . . . Nw number of inputs can be evaluated simultaneously. Now since there are 2(N−M) functions stored in each of the data bits of RASD 620, we get a total of w·2(N−M) different functions, which is the same as the case in FIG. 13.

However as compared to FIG. 13, the number of machine cycles required to evaluate these functions is reduced by a factor of 'w' since 'w' bits of RASD 620 are accessed in parallel. The total number of machine cycles needed to evaluate the w·2(N−M) functions is 2(N−M) cycles instead of the w·2**(N−M) cycles in the scheme of FIG. 13.

Figure 15:
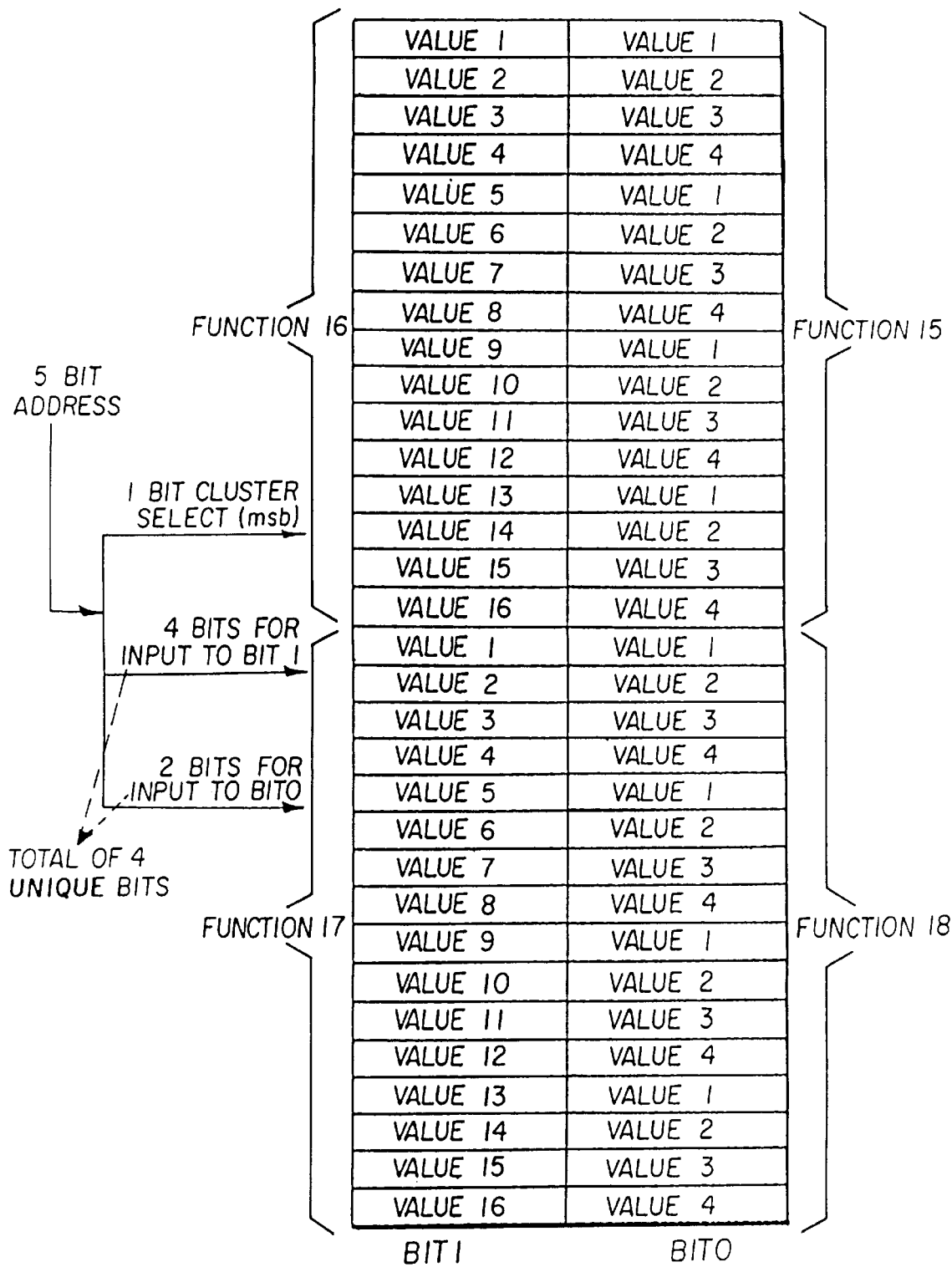
FIG. 15 is a diagram illustrating the manner in which multiple blocks can be evaluated in parallel when two functions require a disjoint set of input bits, but together requiring less than the total number of address bits of a RASD.

In FIG. 15, a five bit address is shown being used for four functions 15–18. The most significant bit identifies a either two functions 15 and 16 forming cluster 1, or the two functions 17 and 18 forming cluster 2. The two functions in Column 1 have four input bits, and accordingly the sixteen output values for each function are shown. The two functions of column 2 have only two input bits. For increased access speed, the four output values corresponding to the two input bits are shown replicated four times. In a single memory access, either the functions of cluster 1 or the functions of cluster 2 can be evaluated. Therefore, at the cost of effective density, more emulation speed can be achieved.

Figure 16A:
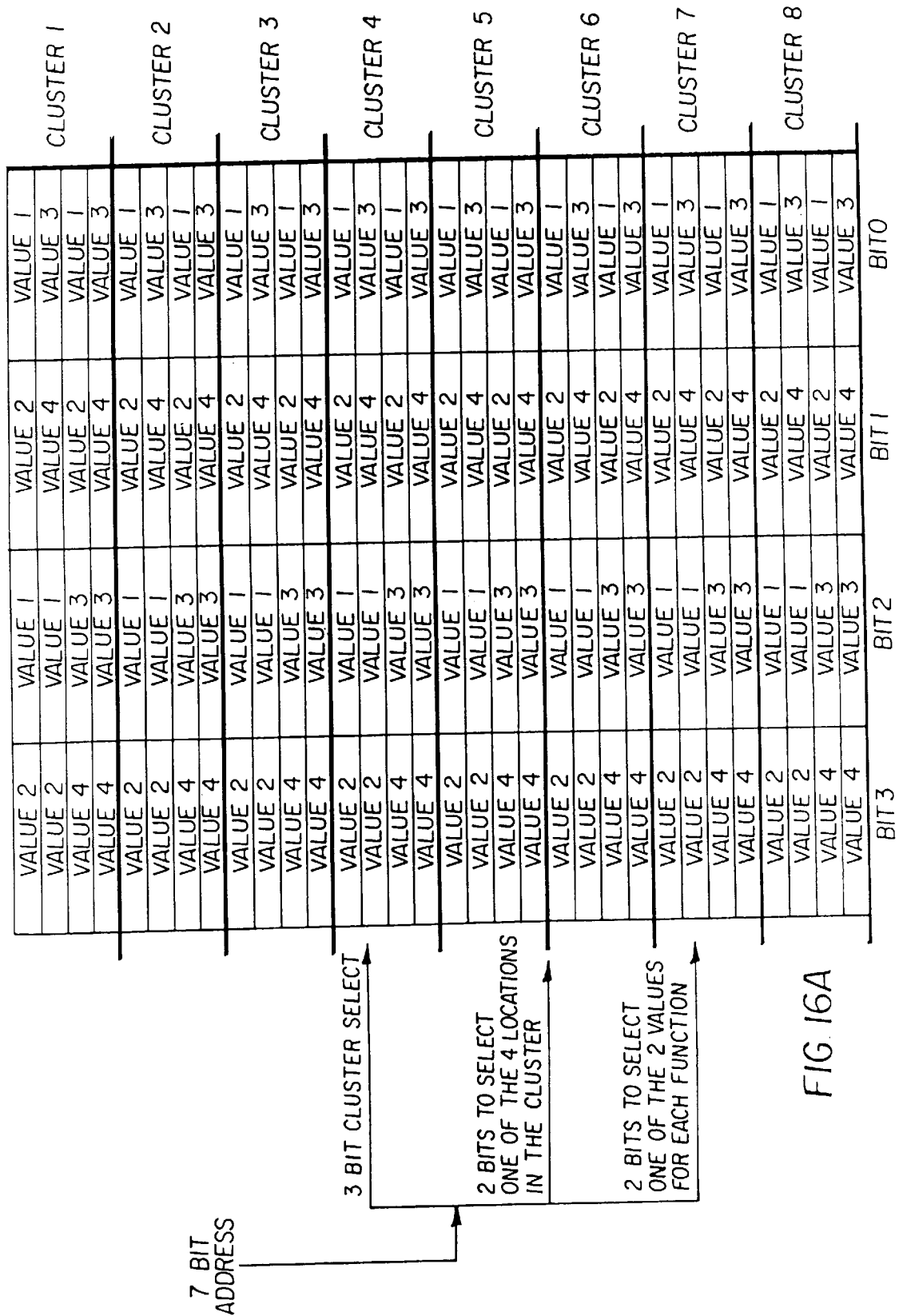
FIG. 16A is a diagram illustrating the manner in which multiple functions can be grouped as cluster to use memory space efficiently.

FIG. 16A illustrates another scheme that the CLOG could use to map combinatorial functions into RASD 620. This scheme may be suited for the case where a verification system is used to perform acceleration for target simulation instead of target emulation. This scheme is best explained with an example. RASD 620 may be assumed to have 32 locations, with each location being 4 bits wide as shown in FIG. 16A. The RASD 620 is divided into 8 clusters, each with 4 memory locations. 3 of the address bits to the RASD 620 are used to address one of the 8 clusters. 4 data bits are accessed from one of the 4 locations in the addressed cluster every machine cycle. 2 address bits are needed to address one of these 4 locations. These 2 bits and the 3 cluster select bits form the complete 5 bit address needed for RASD 620. Now the 4 data bits that are received at XCON 610 can be further selected (using multiplexor 891 of FIG. 8) using 2 sets of 1 bit address lines. The 4 bits are split into 2 groups of 2 bits each and thus one address bit is needed to select one bit out of the 2 bits. This results in two 2 bit functions for every machine cycle. RASD 620 stores in this scheme, 8 clusters with two 2 bits functions each. In a preferred implementation for a simulation accelerator device, the RASD 620 would be 32K locations with 32 bits in each location.

Figure 16B:
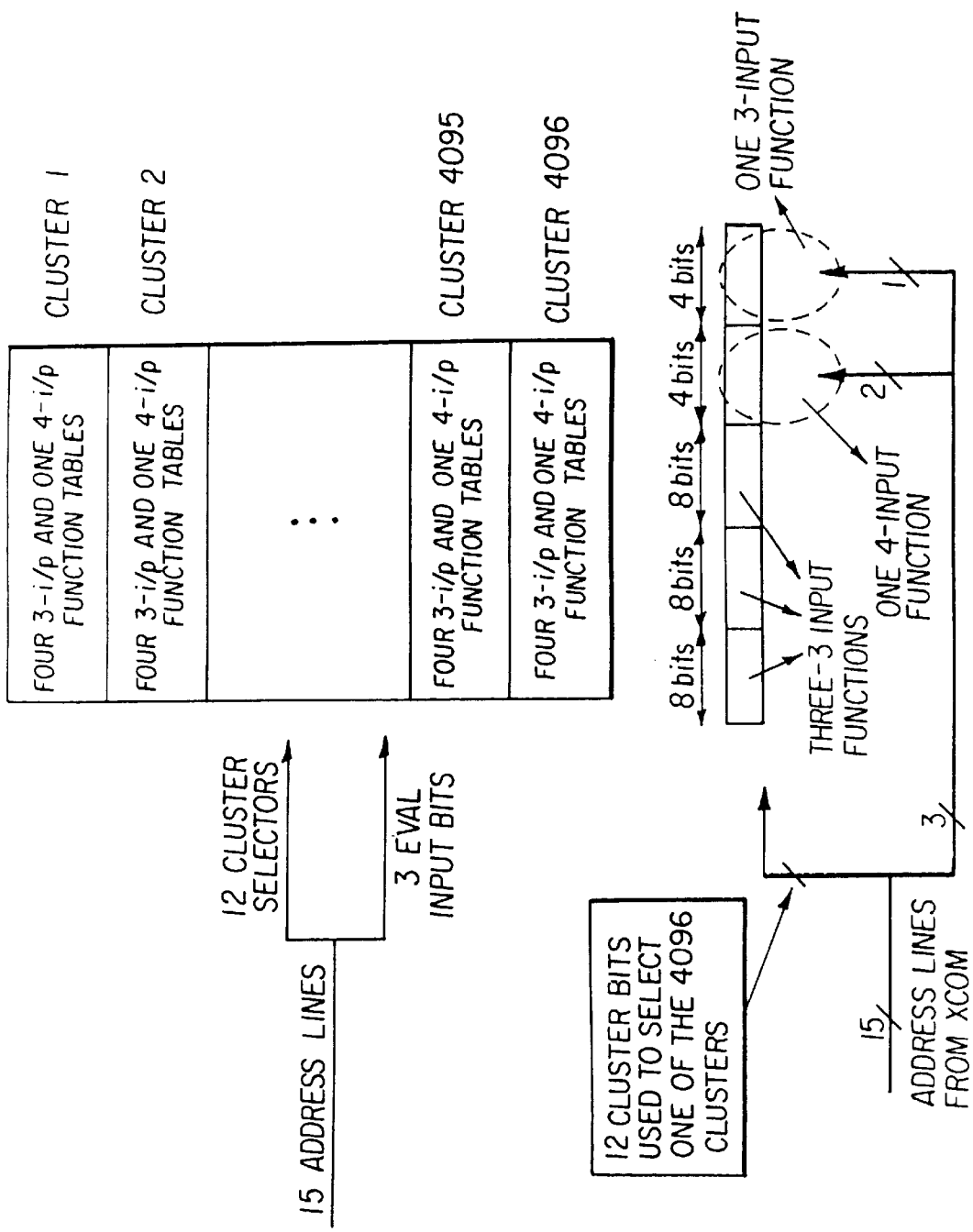
FIG. 16B is a diagram illustrating in further detail the manner in which multiple functions can be grouped as cluster to use memory space efficiently.

FIG. 16B shows how such a RASD 620 can be used to store, using this scheme, four 3-input functions (2 gates each) and one 4-input function (3 gates) with 4K (4,000) clusters. The 12 bit address identifies one of the 4K clusters. Each cluster in turn may have 8 memory locations, with each location including eight bits. The bits in a received location address uniquely identifies a location. Each bit in a location may be identified within XCONs as described above.

The scheme of FIG. 16B results in a density of 4K×11= 44K gates per 32K×32 RASD 620 device. Thus with this scheme it is possible to obtain high density systems with very few RASD 620 devices. The trade-off is the verification speed as the time taken to evaluate would be 4K×20 nsec.

Given a target design and the speed in which the verification needs to be performed, the software can use the flexibility to mix and match these schemes to arrive at the optimal speed and density trade-off for a given target design. To get the optimal speed and density for a given target design, the software should try to partition the target design into as many 'N' input combinatorial functions as possible. This reduces the number of stages in a verification cycle there by increasing the verification speed. It also increases the gate capacity of the verification system, because larger input functions typically tend to contain more gates. However, if the target design has smaller input functions that have a high fan-out it may be optimal to use that function as is rather than aggregate it into a larger input function. The aggregation could lead to a lot of duplication there by reducing the effective gate capacity of the verification system. In these and any other cases where the combinatorial functions are less than 'N' inputs large, scheme of FIG. 14 may be used by the software.

RASDs could also implement a memory that is part of the target system. Since RASD is an array of storage devices, XCON 610 that controls this particular RASD can be easily configured to treat the attached RASD as a regular memory and not a combinatorial logic output. RASD 620 can also be used to store the trace buffer during run time. This can be accomplished by configuring XCON 610 that controls a particular RASD to write into RASD 620 every machine cycle instead of reading out. If there is difference between read and write cycles for a given RASD, XCON 610 would have to accommodate that data for later examination.

One method to partition the problem would be to have one truth table for every combinatorial logic block that exists between any two flip-flops in the target design. Since all these logic blocks are independent in any given verification cycle, all of the blocks can be evaluated in parallel and achieve very high verification speeds. If this partitioning can be achieved for a given target design, then a verification cycle is generally equal to a machine cycle. However, the flip-flop states need to be propagated back to the inputs for the computation for the next verification cycle. On further analysis, even this level of partitioning does not solve the problem of size and time of computation for the truth tables. That is because in many good size designs, there is likely to be enough combinatorial logic blocks that depend on a large enough number of signals. An embodiment of CLOG 510 implemented with some of these considerations is described below in further detail.

14. Combinatorial logic output generator (CLOG) 510

As noted above, CLOG 510 is responsible for partitioning the target design into several blocks (or functions) and assigning the blocks to the CLOEs. CLOG 510 also determines the dependencies between the CLOEs (as determined by the target design) and initializes the control stacks (described above with reference to FIG. 8) in the CLOEs to make sure that the inter-connection matrix is setup between the CLOEs, both for intra-verification cycle dependencies and inter-verification cycle dependencies.

In an embodiment, CLOG 510 receives a target design in the form of a VHDL/Verilog or as a structural net list, the CLOG identifies all the flip-flops in the system and all the combinatorial logic between any two flip-flops. The following rules are taken into consideration for optimal partitioning of a target design:

1) For any flip-flop, if its logic block depends on less number of inputs than the size of a RASD (the 'N' parameter mentioned in the RASD section), then all that logic can be partitioned into one function mapped into one bit of a RASD unit;

2) If the number of inputs is larger than the size of the RASD, the logic needs to be partitioned into blocks that satisfy one of the following conditions:

if a particular logic sub-block has a large fan-out (i.e. large number of other logic blocks depend on its output), then that would become an ideal candidate for a logic function partitioning;

for every output from any arbitrary logic sub-block that depends on no more than the size of the RASD unit ('N') can each be partitioned into a separate logic function and mapped into one bit of a RASD unit.

The interconnection of the various CLOEs is configured from two standpoints:

1) any signals that need to be propagated between CLOEs based on the physical connectivity of flip-flops to each other in the target design, which automatically translates into interconnections between the corresponding logic functions mapped into the RASD units—this leads to interconnections between verification cycles; and 2) If the logic was split up due to the fact that it has more than N inputs, then the logic functions need to exchange their outputs within a verification cycle, which leads to the other form of inter-connectivity between CLOEs.

Once the partitioning and inter-connectivity is completed, then for each of the logic functions, CLOG 510 generates (computes) a truth table, and causes the truth table data to be enumerated by the CLOG and written into various RASD units. Correspondingly the control words for the interconnections can also be initialized for all the CLOEs, for example, as described above with reference to FIG. 8.

The association of the various logic functions to a specific RASD and to a specific CLOE may be determined by:

1. Sharing of the outputs amongst each other, to minimize signal exchange between CLOEs;
2. Sharing of the same inputs, to optimize for verification speed by utilizing the ability of the RASD to read multiple bits in a single machine cycle (as explained in Scheme 2 and Scheme 4 of the RASD section); and
3. Exploiting any parallelisms in computations otherwise possible.

The above criteria should be used to group various logic functions. Ideally the whole group may be associated with one CLOE. If the whole group does not fit into one CLOE then the group of logic functions may be split between directly connected neighboring CLOEs.

All the above mentioned schemes are the most basic functionality that would accomplish a fairly good optimization of verification speed and gate density of the verification system. In order to better optimize it for any target design, some heuristic algorithms can be developed to optimize specifically to run at the highest verification speed for any given target design, on a specified verification system configuration. This can be achieved by starting from the above mentioned schemes since they optimize it for the speed. If the given verification System is unable to fit all the logic functions partitioned by the simple scheme, then the mapping Schemes described with reference to FIGS. 12, 13 and 14 (as described in the RASD section) need to be judiciously used to achieve the fit.

Yet another optimization that could be built into the CLOG would be to identify logic blocks in the target design that have the same truth table. These blocks could then be evaluated using just one function in the RASD. Hence, as can be seen, there is significant impact that a CLOG can have on the behavior of the verification system for the same target design. As a first step, similar software can be used in conjunction with mapping scheme of FIG. 14 for configuring the verification system. Further refinements can then be made to fully take advantage of this invention.

Using the above description, several embodiments of the present invention can be implemented. The configuration of an example implementation of verification system 500 is described below.

15. Sample Configuration of Verification System 500

An embodiment of verification system 500 includes 16 slots in a single chassis 520. Verification boards (e.g., some of 552-A through 522-Z) can be plugged into one or more of these 16 slots. Chassis 520 may have back-plane 521 to inter-connect the 512 signals from each slot. Back-plane 510 may distribute signals from the target system, support workstation and from any other verification chassis to all the slots in this chassis. In addition the chassis may have three sets of cables (not shown in the drawings). One set would be to connect to target system 530 (for emulation environments). This cable set would carry all the primary signals to and from target system 530. The second set would be to connect to the support workstation, CLOG 510 (can be used for receiving input data and sending output data in simulation environments). This set would carry the control, initialization and support information. The last set would be to connect to other verification chassis. A cluster of verification chassis can work together to emulate a huge target system. In case of a cluster one of the chassis is designated to be the master chassis and the others are configured to be slaves.

The gate capacity of a single verification chassis consisting of the 16 verification boards, as described above, can be calculated as follows:

Number of verification Boards in the chassis=16

Number of CLOEs/Board=16

Total CLOEs in the chassis=16*16=256

Number of XCONs in the verification chassis=Number of CLOEs in the verification chassis=256

Number of RASDs per XCON=32 (8 rows*4 banks/row)

Number of functions supported per RASD=w=8

Number of 15-input functions supported for one verification chassis=256*32*8=65536

Equivalent number of gates for a 15-input function=20

Hence, the total number of gates supported=64K*20=1,310,720=1280K gates.

Also, the number of machines cycles needed per verification cycle=w * number of banks. In the case of the above embodiment, number of machine cycles needed per verification cycle is 8*4=32 machine cycles. With a system frequency of 40 MHZ (leading to a machine cycle time of 25 Ns) and assuming an additional 200 Ns for inter-connect delay, the verification frequency would be 1 MHZ.

The 512 signals in the back-plane are accounted for as follows: Each verification board has 16 CLOEs. In turn, each CLOE has 32 RASDs and one XCON that controls all the 32 RASDs. Each CLOE will have 32 signals that can be used to connect to CLOEs on other boards or to the target system. Thus, there may be 32×16=512 signals on each verification board connected to the back-plane. The connections may be implemented using connectors mounted on the verification board.

Several improvements can be implemented without departing from the scope and spirit of the present invention as will be apparent to one skilled in the relevant arts by reading the disclosure provided herein. Some of such improvements are described below.

16. Some Improvements

The above embodiments can be modified in various dimensions to address particular solutions of either increased verification speeds or increased gate capacity.

Modifications to RASD: There are a wide variety of devices that can be used as RASD. A particular verification system can even have a mixture of the various possible RASDs. An embodiment described above is implemented using SRAM. Other possibilities are DRAMs, SSRAMs, SDRAMs. As technology changes and these devices offer faster access speeds, they would become more appropriate for use as RASD.

The density of the verification system depends to a great extent on the capacity of the RASD. The number of total functions supported, for a given number of CLOEs, could be quadrupled by using a 32K deep and 32 bit wide SRAM instead of the 32K deep and 8 bit wide SRAM. This would increase the total target system gates emulated four fold but at one fourth the verification speed. Another option to increase the system capacity is to use higher density RASDs. If a 64K×8 device is used instead, the combinatorial functions can depend on up to 16 inputs instead of 15. Depending on the mapping scheme used by the software this additional bit can instead be used to double the number of functions supported. This would lead to higher capacity for the verification system without a degradation to the verification speed.

Another parameter that can be varied, to obtain better performance, is the access time of the RASD. A 12 Ns access time 32K×8 SRAMs may be selected for low cost. As this changes and other configurations become more cost effective, then those could be used for the RASD. By using a 7 or 10 ns device, the machine cycle can be compressed to 20 ns (or even smaller). This will increase the verification speed by 20%. As the faster devices become cheaper (which is the normal industry trend for memory devices that are used in the PCs), the invention can easily benefit by using these faster RASDs and operating the system at higher clock speeds.

Also for systems where speed is of less importance than the density and cost, DRAMs can be used instead of the SRAMs. The DRAMs would need about 60 ns per access, thus making a 32 step system operate at about 500 KHz.

Modification to XCON: By using a particular type of RASD, changing the XCON configuration is another way to obtain bigger and faster verification systems. The verification speed could be increased for smaller designs by using fewer banks of RASD per XCON. To increase the verification speed of larger designs, more XCONs can be used thus performing more of the combinatorial output evaluation in parallel.

The choice of having 8 rows of RASD per XCON was to keep down the I/O pin requirement for this device. As technology improves, more rows could be controlled by a single XCON, reducing the number XCONs needed for a given target design. Another XCON parameter that could help in increasing the speed of verification, especially for target designs with long stages, is to have more signals to connect to the neighbors or a completely different interconnection scheme than the hierarchical one proposed in the description above.

Modifications to the CLOE: Having more CLOEs on a single verification Board may make the overall system more effective solution.

Modifications to the CLOG: As mentioned in the CLOG section, the complexity of this software can be increased as and when needed to make the mapping of the target design more efficient. Various mapping schemes were discussed and developing a CLOG that used a combination of these schemes to optimize the mapping onto a given verification system configuration, for any given target design should be a straight forward task.

17. Illustration of the Operation of the Present Invention with an Example

Figure 17A:
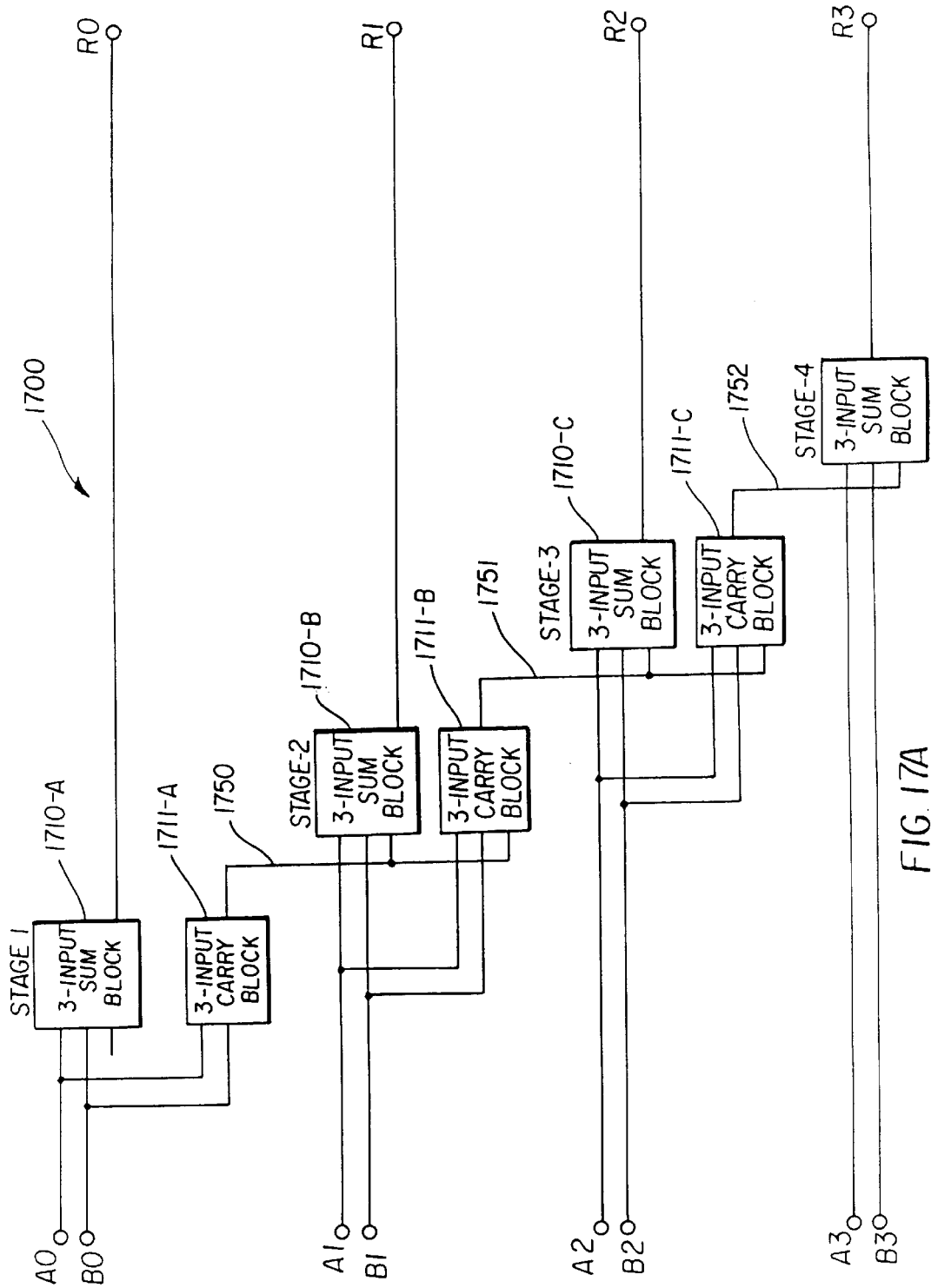
FIGS. 17A, 17B and 17C together illustrate some of the aspects of the operation of the present invention with respect to verifying the functionality of an adder.
Figure 17B:
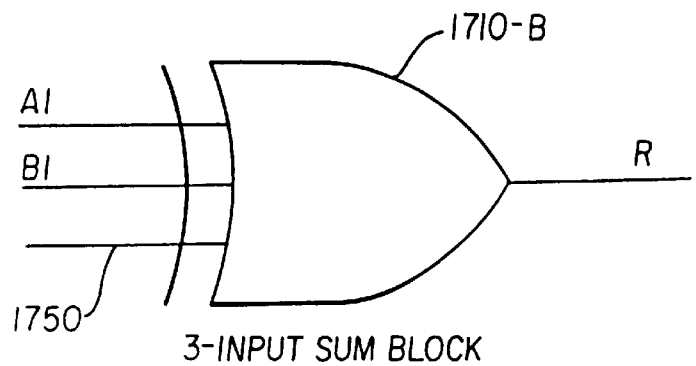
Figure 17C:
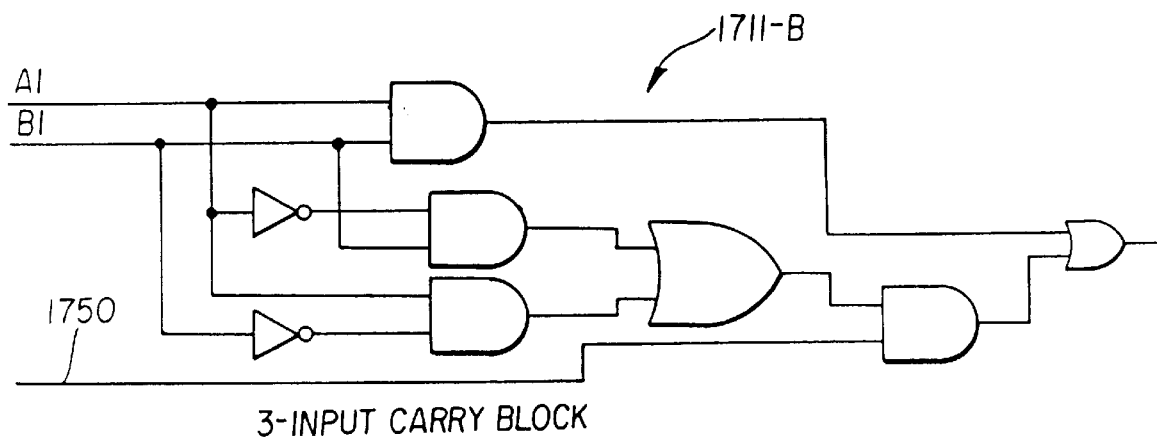

The operation of the present invention is illustrated by an example with reference to FIGS. 17A–C and 18. FIG. 17A is a block diagram of a circuit representing adder 1700. Adder 1700 adds two 4 bit numbers, with one number received on lines A0–A3 and the second number being received on lines B0–B3. The 4-bit output is generated on output lines R0–R3. FIG. 17-B is a block diagram of a representative 3-input sum block 1710-B, and FIG. 17-C is a block diagram of a representative 3-input carry block 1711-B.

In general, CLOG 510 would take to map the target design to the XCON 610. The mapping may entail the following steps:

1. Partition the target design into various stages, with the condition that, in each stage the functions generated can be mapped into the truth tables in RASD 620.

2. If the function of the target design needs truth table with higher input than available in RASD 620, then the CLOG would have to partition the function into smaller input truth tables that would fit in RASD 620.

3. Since the RASD 620 can support only one output value for a function, CLOG may need to partition the target design into truth tables with only one output.

4. When partitioning the target design into smaller input functions, 'stages' are created as shown in FIG. 17. A stage represents a set of blocks, which can be evaluated in parallel without violating the dependencies. The inputs for the functions in a given stage are dependent only on outputs from any previous stage of the target design.

In FIG. 17, 1710-A and 1711-A are functions that are in stage 1, 1710-B and 1711-B are in stage 2, 1710-C and 1711-C are in stage 3 and finally 1710-D is in stage 4. Two primary inputs (A0 and B0) are the inputs to evaluate 1710-A and 1711-A. Thus when the CLOG sets up a RASD 620 to evaluate 1710-A it would configure the multiplexor control stack 870 to select A0 and B0 as the address inputs for the RASD 620 during the first machine cycle. For the same machine cycle the CLOG would set up another RASD 620 to evaluate 1711-A. For XCON 610 that controls RASD 620, the CLOG would set up the multiplexor control stack 870 to also select the primary inputs A0 and B0. Also the CLOG would set up the control stack 840 on this XCON 610 to select intermediate signal 1750 as the output for this machine cycle.

For the second machine cycle the CLOG would set up for the evaluation of blocks 1710-B and 1711-B in the first and second RASD 620 mentioned above. CLOG would set up the stack 830 of the first XCON 610 to select the signal 1750 from the second XCON 610 during this cycle. It would also select A1 and B1 as the other inputs to the RASD 620 for the second machine cycle. In this machine cycle stage 2 functions of the target design (1710-B and 1711-B) are evaluated.

For the third machine cycle, CLOG will set up the stacks in the XCONs 610 to select signal 1751, A2 and B2 as the address lines to the RASDs 620. CLOG would accomplish this by selecting 1751 as one of the inputs using the multiplexor control stack 870. It would also use control stack 880 to drive out the signal 1752 to be used by the XCON 610 in the next machine cycle to evaluate the final stage (stage 4).

In each of these machine cycles the CLOG would also use the control stack word 830 to drive out the primary outputs R0, R1, R2 and R3. Thus the CLOG uses the control stacks 830 to select the appropriate signal from the RASD 620 to be driven out in a given machine cycle.

CLOG uses the control stack 840 to select the signals that are driven out to be used y the other XCONs in the system in a given machine cycle, uses the control stack 870 to select which of the signals from the neighbors are used as address lines to the RASD 620 in a given machine cycle and finally the control stack 880 to select if a function evaluation output from the RASD 620 is to be stored internal to the XCON 610 for later use.

Adder 1700 has been described with reference to several stages for illustration only. However, adder 1700 may be viewed as a single combinatorial block and the truth table for the block may be computed in a known way. The truth table may be used to perform evaluations in single machine cycles as illustrated with reference to FIG. 18.

Figure 18:
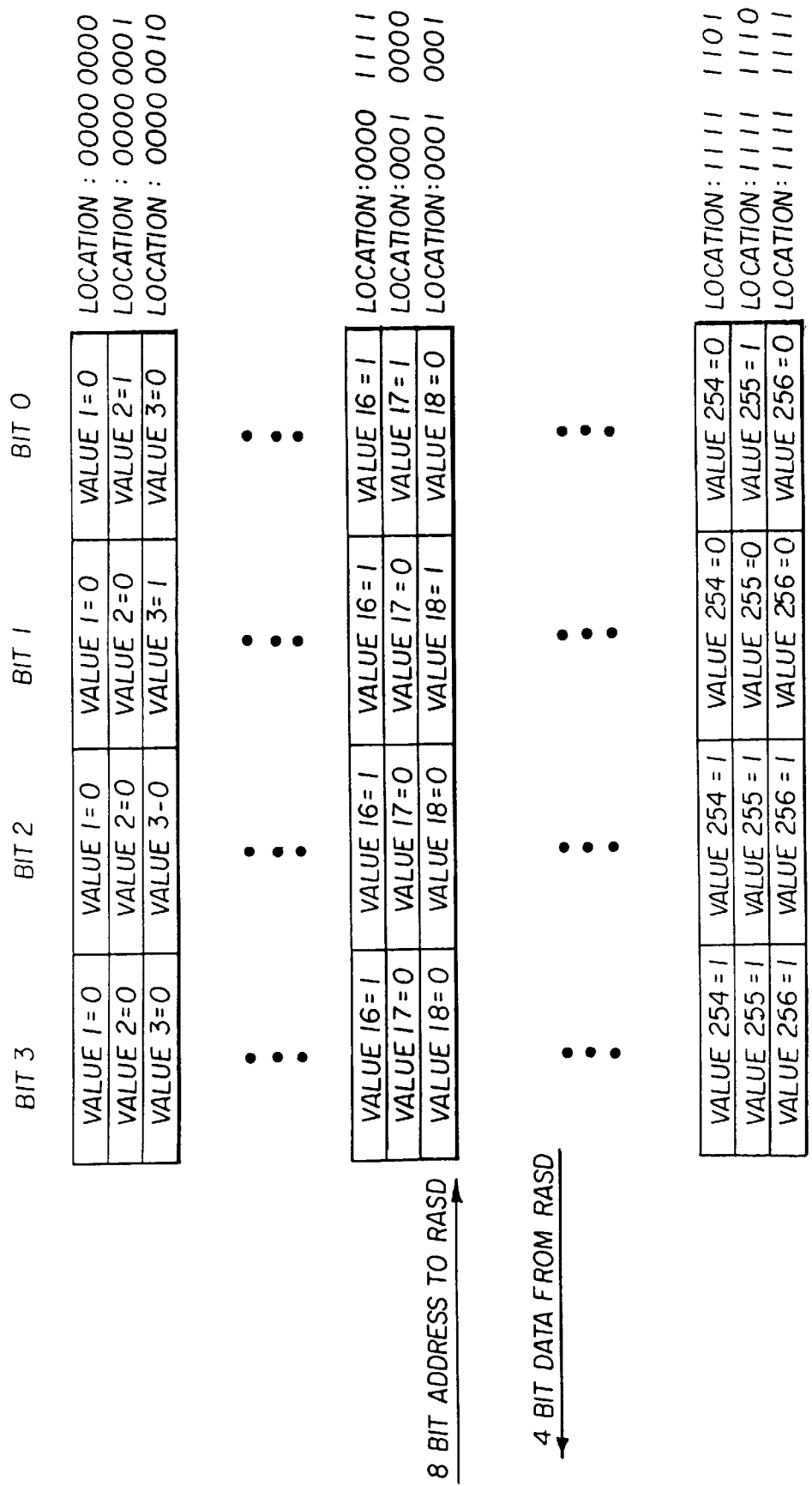
FIG. 18 is a diagram illustrating the manner in which the four outputs of an adder can be evaluated in a single memory access.

FIG. 18 illustrates the manner in which the outputs R0–R3 (as Bits 1–3) can be generated in a single memory access.

The eight bit location address is formed by the eight bits A0–A3 and B0–B3 of FIG. 17A. The four bits stored in RASD 620 represent the output bits R0–R3, which are pre-computed. All the four bits R0–R3 can be generated in a single memory access. Once, generated, multiplexors 891 select respective desired output values on corresponding output lines.

Thus, functional verification can be performed in a cost-effective and efficient manner in accordance with the present invention. Even though the present invention has been described in the context of an emulation application, it should be understood that the present invention can be implemented in a simulation environment as well. In a simulation environment, slower or less number of components can be used as the throughput performance requirements are generally less than in an emulation environment.

18. Conclusion

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A method of verifying the functionality of a target design representing an integrated circuit said target design receiving a plurality of primary inputs and generating a plurality of primary outputs, said method comprising the steps of:

(a) dividing said target design into a plurality of combinatorial blocks and a plurality of sequential elements, wherein said plurality of combinatorial blocks are divided into a plurality of sequences of stages with each output of one stage being provided as input to a subsequent stage in each sequence according to the dependencies in said target design;

(b) computing a truth table for each of said plurality of combinatorial blocks to generate a plurality of truth tables, wherein each of said plurality of truth tables identifies an output value corresponding to each combination of input values of a corresponding one of said plurality of combinatorial blocks;

(c) storing each of said truth tables in a random access storage device (RASD) containing a plurality of memory locations each accessible by a corresponding memory address, wherein the output value of each row of said plurality of truth tables is stored at a memo location having a memory address formed by the input values for the row such that each of said plurality of combinatorial blocks is evaluated by accessing said RASD having a memory address formed by the input values for the truth table;

(d) receiving a plurality of primary input values, each of said plurality of primary input values corresponding to one of said plurality of primary inputs, (e) determining primary output values corresponding to said plurality of primary outputs by evaluating the output values of said plurality of combinatorial blocks, wherein the output values of some of said plurality of combinatorial blocks are used iteratively as input values of some other of plurality of combinatorial blocks in a subsequent stage according to said target design until said primary output values are generated, wherein the determined primary output values are used to verify the functionality of said target design, and wherein the output of each of said plurality of combinatorial blocks is determined by accessing the output value in a corresponding truth table stored in step (c) such that the functionality is verified in a speedy manner.

2. The method of claim 1, wherein said target design is a cycle based design which does not have combinatorial loops.

3. The method of claim 1, wherein step (c) comprises storing only the output values of said truth tables in said memory storage.

4. The method of claim 3, wherein step (e) comprises the step of using the input values for said combinatorial blocks as location addresses for accessing locations in said memory storage.

5. The method of claim 4, wherein said memory storage comprises a plurality of random access storage devices (RASD) having a first number of locations addressed by location addresses, and wherein step (a) comprises the step of:

(f) determining whether a truth table corresponding to a given combinatorial block fits into one of said RASDs; and (g) partitioning said given combinatorial block into a plurality of new combinatorial blocks such that each of said plurality of new combinatorial blocks fit into one of said RASDs.

6. The method of claim 5, wherein step (g) comprises the further step of selecting a block having a large fan-out as a new combinatorial block, wherein fan-out of a block represents a number of combinatorial blocks which use the output value of the block as an input.

7. The method of claim 4, further comprising the steps of:

(h) determining whether any two combinatorial blocks have the same inputs; and (i) storing the output values corresponding to the two combinatorial blocks in the same location such that both of the corresponding output values can be retrieved in the same memory access.

8. The method of claim 5, further comprising the steps of:

(j) determining whether a first combinatorial block requires as inputs a subset of the inputs of a second combinatorial block, wherein a first truth table relates to said first combinatorial block and a second truth table relates to said second combinatorial block, wherein said first truth table is smaller than said second truth table; and (k) storing the two combinatorial blocks in the same RASD.

9. The method of claim 8, wherein step (k) comprises, the step of storing a copy of each output value of said first truth table in a plurality of locations storing said second truth table, wherein location address of said plurality of locations share the inputs of said first combinatorial block such that output value for both said first truth table and said second truth table are retrieved in a single memory access.

10. The method of claim 8, wherein step (k) comprises the step of storing only a single copy of each output value of said first truth table such that one memory access is used to evaluate the output value of said first combinatorial block and another memory access is used to evaluate the output value of said second combinatorial block.

11. The method of claim 5, wherein a first RASD has more address lines than a number of inputs used by combinatorial blocks assigned to said first RASD, said method comprising the further step of using the address lines not corresponding to said input values as a function selector, wherein a function represents one of said plurality of combinatorial blocks generated in step (a).

12. The method of claim 5, further comprising the step of using one or more bits of a location address as a cluster selector, wherein a cluster represents a plurality of truth tables stored in a logical partition of one of said RASDs.

13. The method of claim 12, further comprising the step of changing the number of bits representing said cluster selector to inversely change the number of functions stored in a RASD.

14. The method of claim 1, wherein step (c) comprises the step of storing only the output values of said truth tables in said memory storage.

15. A system for verifying the functionality of a target design, said target design receiving a plurality of primary inputs and generating a plurality of primary outputs, said system comprising:
   a combinatorial logic output generator (CLOG) for dividing said target design into a plurality of combinatorial blocks, wherein said plurality of combinatorial blocks are divided into a plurality of sequences of stages with each output of one stage being provided as input to a subsequent stare in each sequence according to the dependencies in said target design, said CLOG computing a truth table corresponding to each of said plurality of combinatorial blocks, wherein each of said truth tables represents an output value corresponding to each combination of input values of a corresponding combinatorial block;
   a combinatorial logic output evaluator (CLOE) coupled to said CLOG, said CLOE receiving a plurality of primary input values corresponding to each of said plurality of primary inputs, said CLOE generating a plurality of primary output values each corresponding to one of said plurality of primary outputs, said CLOE comprising:
      a plurality of random access storage devices (RASDS) each comprising a plurality of memory locations each accessible by a corresponding memory address, wherein the output value of each row of said plurality of truth tables is stored at a memory location having a memory address formed by the input values for the row such that each of said plurality of combinatorial blocks is evaluated by accessing said RASDs having a memory address formed by the input values; and
      a plurality of cross connects (XCONs) determining primary output values corresponding to said plurality of primary outputs by evaluating the output values of said plurality of combinatorial blocks, wherein the output values of some of said plurality of combinatorial blocks are used iteratively as in-put values of some other of said plurality of combinatorial blocks in a subsequent stage according to said target design until said primary output values are generated,
      wherein the determined primary output values are used to verify the functionality of said target design.

16. The system of claim 15, wherein said plurality of RASDs and said plurality of XCONs are implemented in a plurality of chassis, with each chassis including a plurality of boards, with each board including a plurality of XCONs.

17. The system of claim 16, wherein said plurality of XCONs in a board include a central XCON for providing intra-board communication with XCONs in another boards, wherein communication between CLOEs enables said system to maintain dependencies in said target design.

18. The system of claim 15, wherein each of said plurality of XCONs forms a location address of a RASD from the input values corresponding to combinatorial blocks stored in the RASD.

19. The system of claim 18, wherein each of said plurality of XCONs comprises a local storage for storing the output values retrieved from said plurality of RASDs such that said stored output values can be provided as a part of said location address during a subsequent machine cycle.

20. The system of claim 19, wherein each of said plurality of XCONs further comprises a first multiplexor for selecting as a bit of said location address one of said stored output value bit, a bit from a neighboring XCON, a bit from a different chassis, and a bit of a primary input.

21. The system of claim 20, wherein each of said plurality of XCONs further comprises a first multiplexor controller for controlling the sequence of selections of said multiplexor, wherein said first multiplexor controller is configured by said CLOG according to the division of said target design such that the data dependencies in said target design are preserved during the evaluation of said plurality of combinatorial blocks.

22. The system of claim 21, wherein each of said plurality of XCONs further comprises a counter coupled to said first multiplexor, said counter being configured to provide a bit of said location address when the aggregate number of input bits of blocks stored in a RASD is less than the number of bits in said location address.

23. The system of claim 22, wherein said first multiplexor controller comprises a stack.

24. The system of claim 19, wherein each of said plurality of XCONs further comprises a second multiplexor coupled to the output of said first multiplexor, said multiplexor receiving a access unit from one of said plurality of RASDs, said access unit comprising a plurality of output values, said second multiplexor receiving a control word from said first multiplexor, said control word causing said second multiplexor to select on said plurality of output values in said access unit, said selected output value bit corresponding to a desired output value.

25. The system of claim 19, wherein each of said plurality of XCONs further comprises:
   a first bus coupled to XCONs on an external board, wherein said bus is designed to receive and send output values between XCONs located on different boards;
   a third multiplexor for receiving the output values stored in said local storage and selectively providing said output values on said bus; and
   a tri-state buffer coupled between said third multiplexor and said bus, said tri-state buffer enabling said third multiplexor to send output values on said bus, and isolating said third multiplexor from said bus when output values are received on said third multiplexor.

26. The system of claim 25, wherein each of said plurality of XCONs further comprises a fourth multiplexor coupled to a plurality of XCONs located on a single board, said fourth multiplexor selectively forwarding as an output one of a bit received on said first bus, a bit received on a third bus coupled to an XCON on said single board, a bit from said local storage, and a bit received from one of said plurality of RASDs in the same machine cycle.

27. The system of claim 14, wherein said CLOG is designed to provide said plurality of primary inputs and receives said plurality of primary outputs, such that said system can be used in a simulation environment.

28. The system of claim 14, wherein said CLOEs are coupled to an external system, wherein said target design represents a component of said external system, said CLOE receiving as said plurality of primary outputs the input data values which said component would have received, and providing said plurality of primary outputs as outputs of said component such that said system can be used in an emulation environment.

29. The method of claim 14, wherein only the output values of said truth tables are stored in said RASDs.

30. A system for verifying the functionality of a target design, said target design receiving a plurality of primary inputs and generating a plurality of primary outputs, said system comprising:

a dividing means for dividing said target design into a plurality of combinatorial blocks and a plurality of sequential elements, wherein said plurality of combinatorial blocks are divided into a plurality of sequences of stages with each output of one stage being provided as input to a subsequent stage in each sequence according to the tendencies in said target design;

computing means for computing a truth table for each of said plurality of combinatorial blocks, wherein a truth table identifies an output value corresponding to each combination of input values of a corresponding combinatorial block;

random access storage means comprising a plurality of memory locations each accessible by a corresponding memory address, wherein the output value of each row of said plurality of truth tables is stored at a memory location having a memory address formed by the input values for the row such that each of said plurality of combinatorial blocks is evaluated by accessing said random access storage means having a memory address formed by the input values;

receiving means for receiving a plurality of primary input values, each of said plurality of primary input values corresponding to one of said plurality of primary inputs;

determination means for determining primary output values corresponding to said plurality of primary outputs by evaluating the output values of said plurality of combinatorial blocks, wherein the output values of some of said plurality of combinatorial blocks are used iteratively as input values of some other of plurality of combinatorial blocks in a subsequent stage according to said target design until said output values are generated, wherein the determined output values are used to verify the functionality of said target design, and wherein the output of each of said plurality of combinatorial blocks is determined by accessing the output value in a corresponding truth table stored in said storage means such that the functionality is verified in a speedy manner.

31. The method of claim 29, wherein only the output values of said truth tables are stored in said storage means.

* * * * *